US006125268A

United States Patent [19]
Boesch et al.

[11] Patent Number: 6,125,268
[45] Date of Patent: Sep. 26, 2000

[54] TUNING BANDWIDTH MINIMIZATION FOR LOW VOLTAGE DUAL BAND RECEIVER

[75] Inventors: Ronald D. Boesch, Morrisville; Rodney A. Dolman, Cary, both of N.C.

[73] Assignee: Ericsson Inc., Research Triangle Park, N.C.

[21] Appl. No.: 09/013,926

[22] Filed: Jan. 27, 1998

Related U.S. Application Data

[63] Continuation-in-part of application No. 08/974,227, Nov. 19, 1997.

[51] Int. Cl.[7] .............................. H04B 1/18; H04B 17/02; H04B 1/10
[52] U.S. Cl. .................. 455/168.1; 455/307; 455/189.1; 455/147
[58] Field of Search .......................... 455/76, 86, 189.1, 455/188.1, 84, 553, 168.1, 147, 375, 307, 552, 75

[56] References Cited

U.S. PATENT DOCUMENTS

| | | | |
|---|---|---|---|
| 5,095,288 | 3/1992 | Dent | 331/17 |
| 5,180,993 | 1/1993 | Dent | 331/16 |
| 5,499,394 | 3/1996 | Kaatz et al. | 455/307 |
| 5,535,432 | 7/1996 | Dent | 455/77 |
| 5,610,559 | 3/1997 | Dent | 331/2 |
| 5,852,772 | 12/1998 | Lampe et al. | 455/226.2 |
| 5,890,051 | 3/1999 | Schlang et al. | 455/76 |

FOREIGN PATENT DOCUMENTS

| | | |
|---|---|---|
| 0 744 831 | 11/1996 | European Pat. Off. |
| 0 798 880 | 10/1997 | European Pat. Off. |
| 0 800 283 | 10/1997 | European Pat. Off. |

Primary Examiner—Dwayne D. Bost
Assistant Examiner—Raymond B. Persino
Attorney, Agent, or Firm—Burns, Doane, Swecker & Mathis, L.L.P.

[57] ABSTRACT

A mobile radio telephone having a minimized tuning bandwidth, based on limiting intermediate frequencies at the highest and lowest expected receive frequencies in each band. A dual band, dual mode mobile phone can be constructed which maintains or improves intermodulation performance using fewer battery cells without additional circuitry.

10 Claims, 22 Drawing Sheets

FIGURE 1: PRIOR ART REFERENCE FREQUENCY DISTRIBUTION

FIGURE 2: OTHER PRIOR ART REFERENCE DISTRIBUTION SCHEME

FIGURE 3: DOLMAN'S REFERENCE FREQUENCY DISTRIBUTION

FIGURE 4: INVENTIVE REFERENCE FREQUENCY DISTRIBUTION

FIGURE 5: INVENTIVE FREQUENCY SYNTHESIS ARRANGEMENT

FIGURE 6: ANOTHER INVENTIVE SYNTHESIS ARRANGEMENT

FIGURE 7: ALTERNATIVE WITHOUT FREQUENCY DOUBLERS

FIGURE 8: ALTERNATIVE WITH A DOUBLER AND A DIVIDE-BY 2

FIGURE 9: ALTERNATIVE WITH A DIVIDE BY 2 AND A DOUBLER

FIGURE 10: FIRST LO CONTROLLED AT LOWER FREQUENCY

FIGURE 11: FIGURE 10 MODIFIED TO USE FREQUENCY HALVERS

FIGURE 12: DUAL-MODE REFERENCE FREQUENCY DISTRIBUTION

FIGURE 13: DIVIDER RATIOS FOR FIGURE 12

*: The first LO is sidestepped 240KHz for D-AMPS transmit at 1900MHz

FIGURE 14: DUAL-MODE WITH I.F. HOMODYNE FOR PCS1900

FIGURE 15: DUAL-MODE WITH SINGLE CRYSTAL

FIGURE 16: DIVIDER RATIOS FOR FIGURE 15

FIGURE 17: DUAL-MODE WITH TWO REFERENCE CRYSTALS

FIGURE 18: DIVIDER RATIOS FOR FIGURE 17

FIGURE 19: DIVIDER RATIOS TO ELIMINATE THE SECOND CRYSTAL

FIGURE 20: SKIP COUNTER TO GENERATE 194.4KS/S from 19.5MHz

TUNING BANDWIDTH MINIMIZATION FOR LOW VOLTAGE DUAL BAND RECEIVER

This application is a continuation-in-part of application Ser. No. 08/974,227, filed Nov. 19, 1997.

FIELD OF THE INVENTION

The invention relates to mobile communications using a selected pair of transmit and receive frequencies and relates to the minimization of the tuning bandwidth of a main VCO oscillator.

BACKGROUND OF THE INVENTION

It is well known in the art of mobile radiotelephones to employ a receiver for receiving a receive frequency signal while a transmitter simultaneously transmits a transmit frequency signal in the other direction, the transmit frequency being separated from the receive frequency by a constant offset known as the duplex spacing.

Although the duplex spacing is nominally a constant, it can be a different constant depending on the frequency band in which the mobile phone is operating. Complications can then arise in constructing mobile phones that operate in more than one frequency band.

U.S. patent application Ser. No. 08/795,930 entitled "Transmit Signal Generation with the Aid of Receiver" (Dolman) describes the use of the second local oscillator of the receiver as a reference frequency against which a transmit frequency is controlled relative to a receive frequency to achieve either a first or a second duplex spacing. The Dolman application is hereby incorporated by reference.

It is also known in the prior art, when packaging two synthesizer PLL circuits into a common integrated circuit, to synchronize or otherwise relate the reference dividers of the two PLLs so that their phase comparators do not mutually interfere. The Philips UM1005 and 8026 dual synthesizer integrated circuits available on the open market use this technique. These circuits include the use of fractional-N dividers and programmable loop bandwidth, such as described in U.S. Pat. Nos. 5,095,288 and 5,180,993 which are hereby incorporated by reference. Novel ways to employ such synthesizers in dual mode satellite/cellular telephones in order to achieve different tuning step sizes in different frequency bands are described in U.S. Pat. Nos. 5,535,432 and 5,610,559 which are also hereby incorporated by reference.

Continuous advances in electronics allow for smaller mobile phones complying with a variety of national and international protocols. The international mobile phone standard known as GSM in Europe and as PCS 1900 in the USA operates with a transmit/receive duplex spacing of 45 MHz in the European 900 MHz band; 95 MHz in the European 1800 MHz band, and 80 MHz in the U.S. 1900 MHz PCS band. The channel spacing is 200 KHz (13 MHz/65) and the transmitted symbol rate is 13 MHz/48. All timing in this standard is related to a 13 MHz clock, as is well known. The U.S. IS 136 system known as DAMPS operates with a 45 MHz duplex spacing in the US 800 MHz cellular band, and with an 80.4 MHz duplex spacing in the U.S. 1900 MHz PCS band, with a tuning step size of 30 KHz and a transmitted symbol rate of 24.3 Kilosymbols/sec. In IS 136, as is well known, the tuning step sizes and symbol rates and internal timing are all derivable from a 19.44 MHz clock. Yet another U.S. standard known as IS95 uses Code Division Multiple Access at a transmitted chip rate of 1228.8 MHz, with a duplex spacing of 45 MHz combined with tuning steps of 30 KHz in the 800 MHz band, alternatively 50 KHz steps combined with 80 MHz duplex spacing in the 1900 MHz band. In IS95, the chip rate and frequency step sizes are not easily derivable from the same crystal oscillator. It may be easily understood that combining two or more of the abovementioned protocols in the same handheld unit is hindered by the variety of tuning step sizes, duplex spacings and symbol rates that must be synthesized. Consequently, there exists a need for an improved radio architecture to facilitate such combination.

As mobile phones are designed with fewer battery cells, the requirements for a suitable VCO (voltage controlled oscillator) in the receiver become more complex. The requirements present significant challenges for a 3 cell dual band phone. The VCO single sideband (SSB) phase noise determines the close in intermodulation performance of the receiver. The ability to meet this requirement is related to the gain ($K_v$) of the VCO and is more difficult as the gain is increased. The gain has the units of MHz/volt where MHz is the amount of frequency coverage of the VCO and volt is the amount of voltage that is available to move the varactor capacitance. For a fixed tuning range of, for example, 75 MHz, the VCO gain $K_v$ increases with decreasing battery voltage. For a 5-cell phone the tuning voltage range would be 0.5 V to 4.3 V for a $K_v$ of 20. A 3-cell phone has a range of 0.5 to 2.2 V for a $K_v$ of 44. It is much more difficult to meet the SSB phase requirement in a 3-cell phone with one VCO for both bands given this significantly higher $K_v$.

One way to solve the close in intermodulation problem of a low-voltage dual-band receiver is to have a separate receive VCO for each band in a dual band phone. However, this solution requires 2 VCOs for a dual band receiver, and therefore is expensive and not space efficient. A second way would be to have a switched tank circuit for the receiver VCO. However, this solution is unacceptable because it draws current, which significantly decreases standby time in the band where the switch draws current.

SUMMARY OF THE INVENTION

The present invention overcomes the above-described problems, and achieves additional advantages, by providing for a multiple band communication receiver which uses a single voltage controlled oscillator to generate intermediate frequency signals from the signals received in first and second bands. The gain and tuning range of the oscillator are minimized by limiting the intermediate frequencies in each band to a range defined by the relationship $RX_1-2RX_2$, where $RX_1$ and $RX_2$ are the receive frequencies for first and second bands, respectively. More particularly, the range is determined by calculating first and second values using highest and lowest expected receive frequencies for each band.

The present invention can minimize the tuning range of the single voltage controlled oscillator to 30 MHz, and can result in a VCO gain of approximately 17.6 for a receiver which operates in both the PCS and cellular (AMPS) bands, thereby enabling the receiver to maintain or improve intennodulation performance using fewer battery cells without additional circuitry.

BRIEF DESCRIPTION OF THE DRAWINGS

The invention will be more fully understood upon reading the following description with reference to the accompanying drawings, in which.

DETAILED DESCRIPTION OF THE PREFERRED EMBODIMENTS

Figure 1:
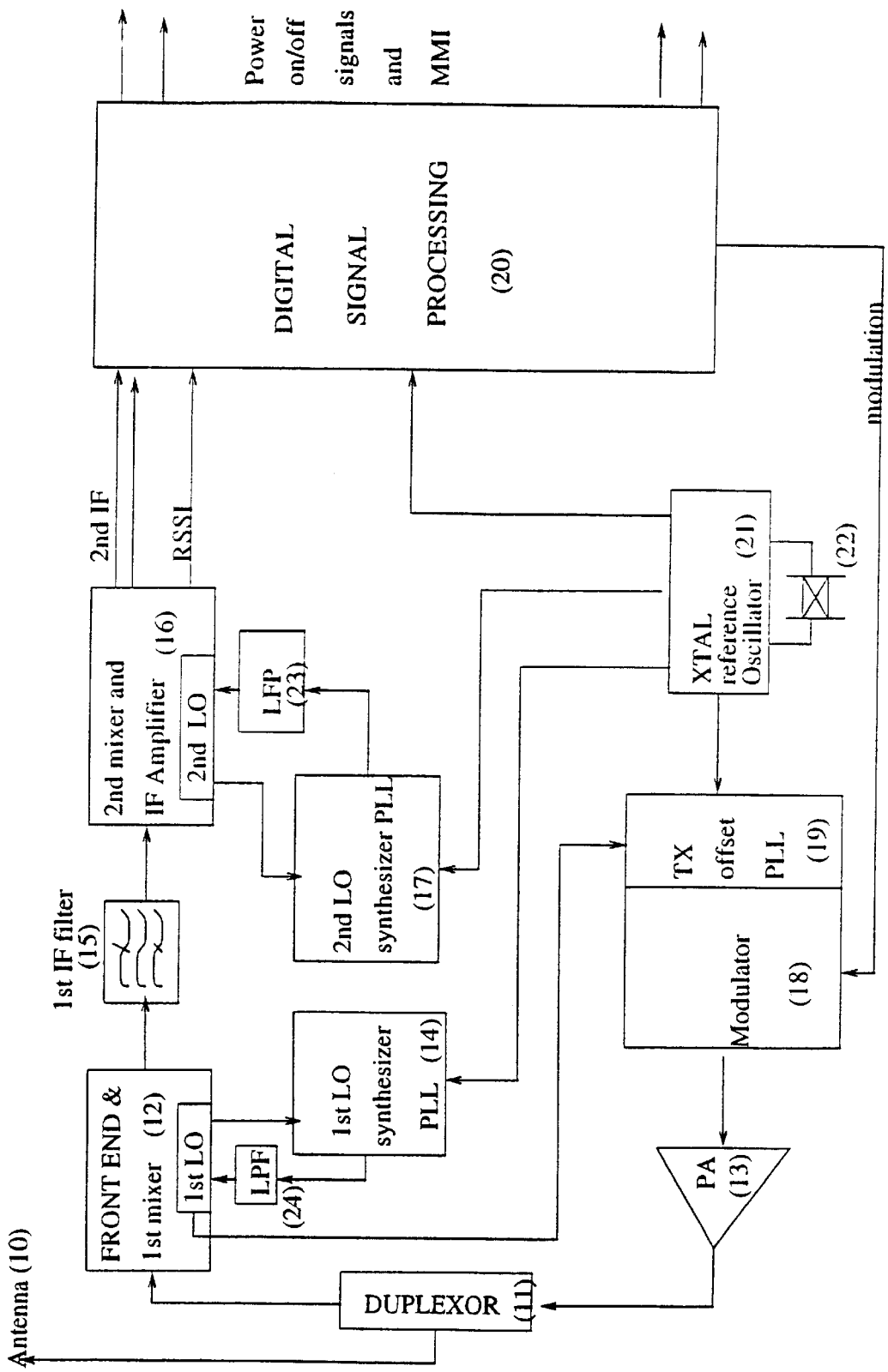
FIG. 1 illustrates prior art reference frequency distribution.

Referring now to FIG. 1, a prior art cellular phone comprises an antenna (10) connected to a receiver and a transmitter by means of a transmit/receive duplexor (11). When simultaneous transmit and receive (frequency duplex) is used, as in the analog FM AMPS standard or the IS95 CDMA standard, the duplexor (11) is a duplexing filter. Alternatively, for a TDMA system such as GSM/PCS1900 or D-AMPS/IS136 that employs time-duplex, the duplexor can be a T/R switch. For dual band phones employing frequency duplex in one band and time duplex in another band, duplexor (11) can be a dual-band duplexor having both a switch and a duplexing filter. When frequency duplex is used in both bands, duplexor (11) could comprise duplexing filters for both bands, and when time duplex is used in both bands, a single T/R switch might serve for both bands.

The duplexor allows the transmitter to be connected to the antenna without affecting receiver sensitivity. The receiver comprises a low noise amplifier and downconvertor known as "the front end", (12). The front end can be fabricated in a single integrated circuit comprising a low-noise amplifier, a downconverting and possibly image-rejecting mixer and a first local oscillator, for each of two or more different frequency bands (such as the 800 MHz and 1900 MHz bands).

The first local oscillator mixes with the desired receive frequency signal to produce a first intermediate frequency signal. Filtering can take place with a fixed frequency bandpass filter, IF filter (15). The desired receive frequency is selected by tuning the local oscillator to a frequency equal to the sum or the difference of the desired receive frequency and the hfirst IF, by means of first local oscillator synthesizer phase lock loop (14). The 1st LO PLL tunes the 1st LO to a programmable integer multiple of a basic tuning step size, which is derived from a crystal reference oscillator (21) by dividing the crystal frequency by another integer to get the step size. For small step sizes, the synthesizer may alternatively derive a greater step size from crystal oscillator (21) by dividing by a smaller integer, and then interpolate between these larger steps to get the desired smaller steps using the technique of fractional-N synthesis described in the above-incorporated references. First LO PLL circuit (14) compares the 1st LO frequency to the crystal reference signal and generates an error signal. The error signal is filtered and integrated in Loop Filter (24) to produce a control signal to control the oscillator frequency until the frequency is exactly as intended.

The receiver amplifies the filtered 1st IF signal and then customarily performs a second frequency downconversion using a second heterodyne mixer and second local oscillator. The IF amplifiers, second local oscillator and second mixer are all contained in a conventional second integrated circuit (16). After downconverting a second time to a second or final Intermediate frequency, further amplification may take place at the final IF and a detector circuit can be employed to produce a Radio Signal Strength Indication (RSSI) related to the strength of the received signal. The second IF amplifier may be hardlimiting, and then outputs a hardlimited final IF signal to digital signal processing (20) where phase information is extracted and digitized using the second IF signal simultaneously with digitizing the RSSI signal, as described in U.S. Pat. No. 5,048,059 entitled "Log-polar signal processing", which is hereby incorporated by reference herein. The second local oscillator part of IF amplifier circuit (16) is also controlled to the desired frequency by means of a synthesizer PLL circuit (17) and loop filter (23). The 2nd LO frequency is compared with the crystal oscillator (21) and an error signal produced as before. Thus both synthesizer circuits (14) and (17) use the crystal as the frequency reference or standard of accuracy for controlling both the first and second LO. The digital signal processing logic (20) can also require an accurate frequency standard for producing receiver sampling and processing rates and transmit symbol rates, and so is also fed with an output from crystal oscillator (21).

The transmitter comprises transmit frequency generation circuit (19) for producing a signal offset from the receive frequency by the fixed duplex spacing. The transmit frequency is thus offset from the 1st LO frequency by the duplex spacing combined with the first intermediate frequency, which nevertheless is still a constant offset. The constant transmit offset is either equal to the first IF minus the duplex spacing or the first IF plus the duplex spacing, depending on whether the 1st LO is lower or higher than the receive and transmit frequencies.

The transmit frequency signal is then modulated with information from digital signal processor (20) using modulator (18), which is for example a quadrature modulator having I and Q input signals. The modulated signal is then amplified to a transmit power level using power amplifier (13), which may be a dual-band power amplifier in a dual-band phone.

Transmit offset PLL forms the difference between the transmit and 1st LO frequencies and tests to see if it equals the desired offset, by comparing the offset with the crystal reference. The TX offset PLL thus also has need of a crystal reference frequency signal from oscillator (21), making four places to which the oscillator signals must be distributed.

The four separate outputs from oscillator (21) must be sufficiently isolated from one another by buffer amplifiers and conditioned to drive copper tracks on the printed circuit motherboard. This consumes battery power and presents a radiated interference hazard. Often, to save battery power during standby, outputs which are momentarily not required, such as that feeding the transmit offset PLL, may be turned off by control signals from a control processor (part of digital signal processing 20), which is a further complication. It is thus desirable to reduce the distribution of the crystal reference signal by means of printed circuit board tracks to multiple destinations.

A first step in this direction is already taken in prior art products sold by Ericsson in the USA. By combining the first and second LO PLLs in a single chip, such as the Philips UM1005 or 8026 part, a single input for the crystal reference may be used, since both use the crystal as the reference. Further, by combining crystal oscillator (21) into a transmit signal generator chip together with TX offset PLL and modulator (18), no external output connection between oscillator (21) and offset PLL (19) is needed.

Figure 2:
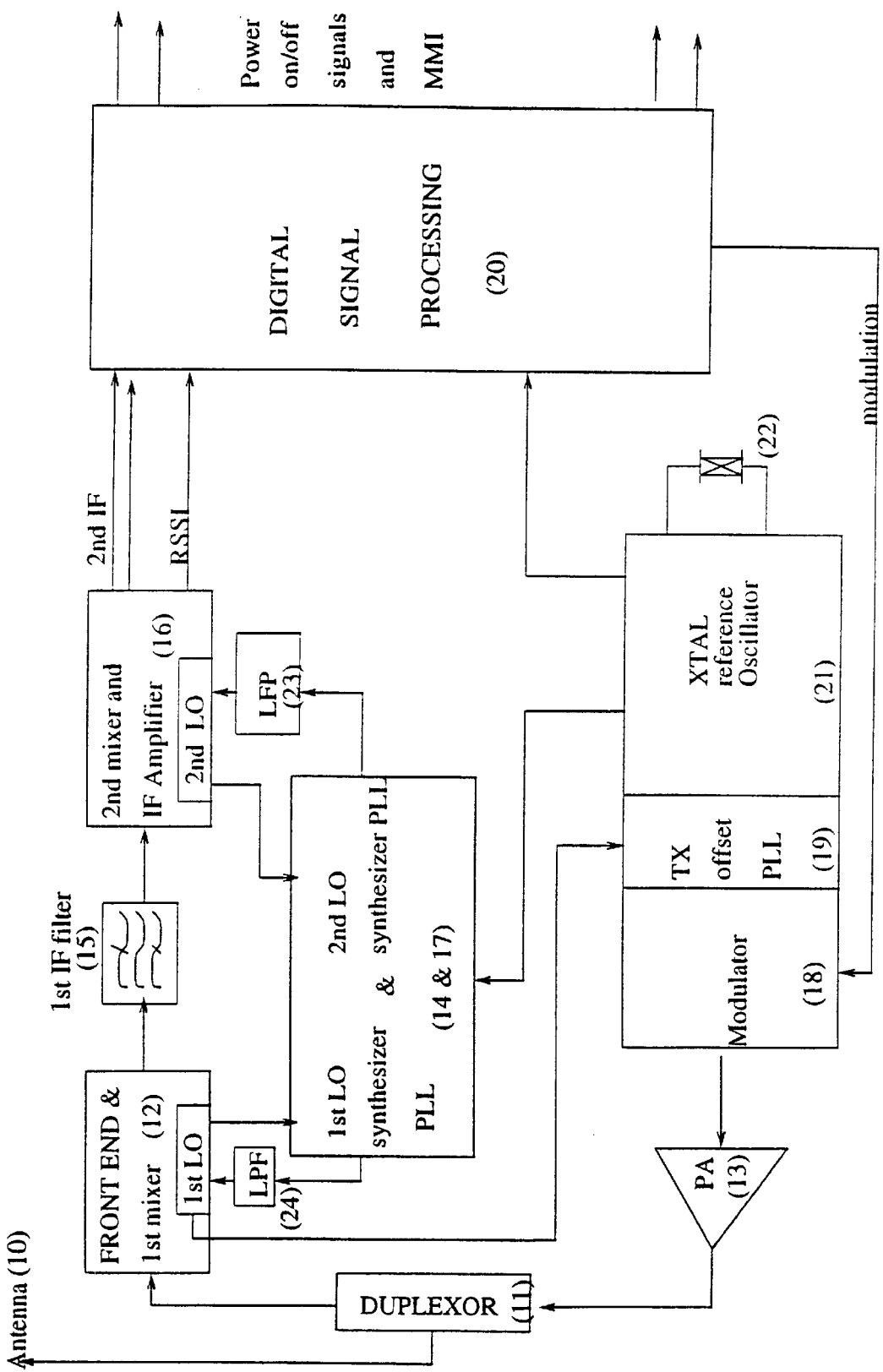
FIG. 2 illustrates another prior art scheme.

Thus, referring to FIG. 2, the number of crystal reference signal outputs required is reduced to two, one feeding dual synthesizer circuit (14+17) and the other feeding digital signal processing (20).

Figure 3:
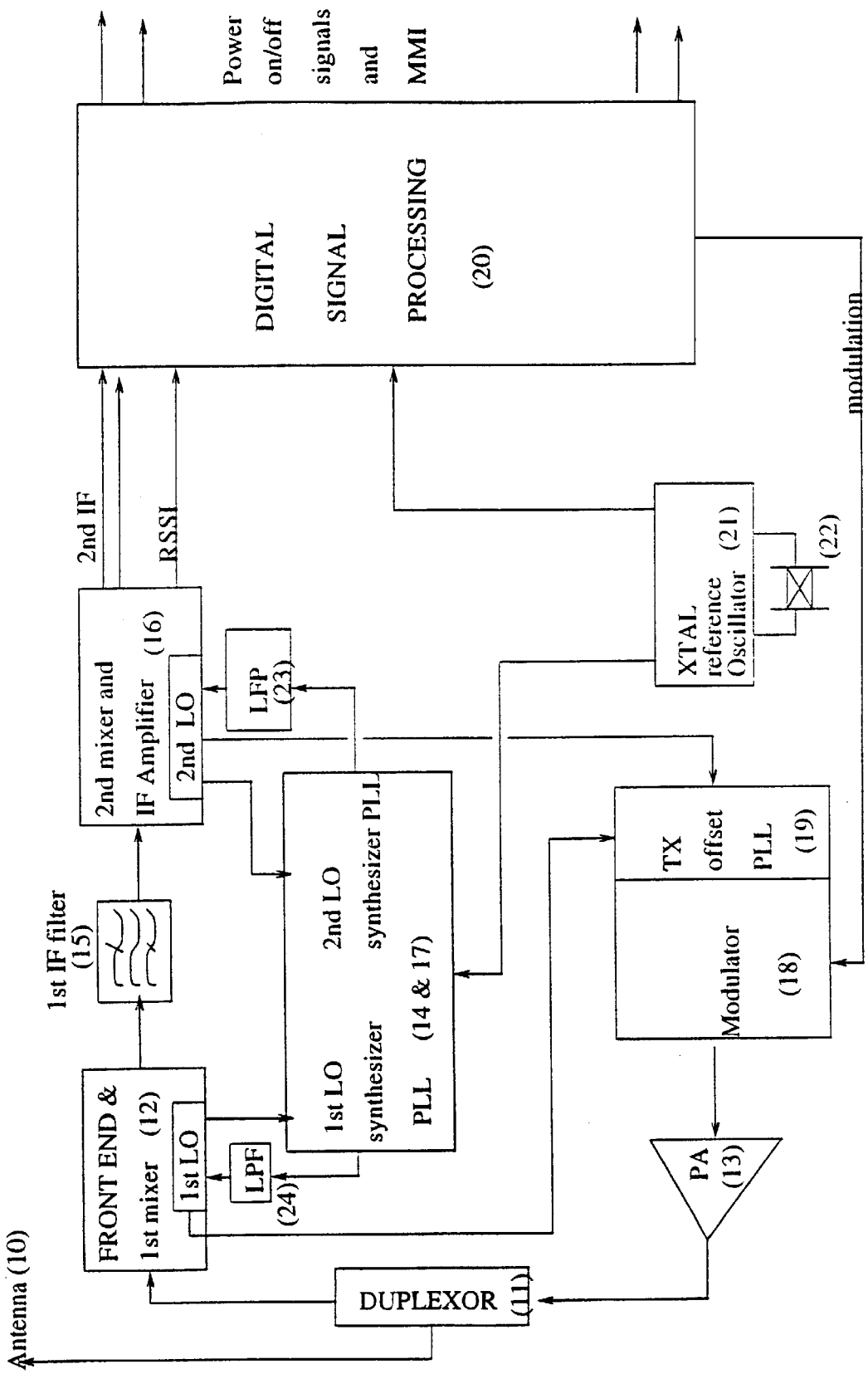
FIG. 3 illustrates the improved system described in the incorporated Dolman reference.

In U.S. patent application Ser. No. 08/795,930 to Dolman, incorporated above, it is explained that all PLLs desirably operate by dividing the crystal reference frequency by the smallest possible integer for comparison with the frequency of the oscillator they are controlling, which is also divided by the smallest possible integer. Expressing this another way, it is desired to have the largest possible common factors between the controlled oscillator frequencies and the reference frequency. Dolman discloses that this is facilitated when the transmit offset frequency is generated using the 2nd LO as the reference frequency rather than the crystal (22). Dolman's inventive arrangement is shown in FIG. 3.

The second LO provides a first output signal to its controlling PLL (17) and a second output to TX offset PLL (19). Since the crystal oscillator is now not used for any purpose in transmit circuits (18,19) oscillator (21) is shown once more as a separate circuit (21), having two buffered outputs. The total number of radio frequency signal outputs has however increased, as has the number of separate integrated circuit chips. The radio frequency signals distributed on the printed circuit board are as follows:

1) 1st LO signal from frontend (12) to PLL (14);
2) 1st LO signal from frontend (12) to TX offset PLL (19);
3) Crystal reference frequency from oscillator (21) to PLL (14+17);
4) Crystal reference frequency from oscillator (21) to processing (20);
5) 2nd LO from IF chip (16) to controlling PLL (17); and
6) 2nd LO from IF chip (16) to TX offset PLL (19).

It is an object of the current invention to reduce the number of RF distribution tracks from the six enumerated above.

Figure 4:
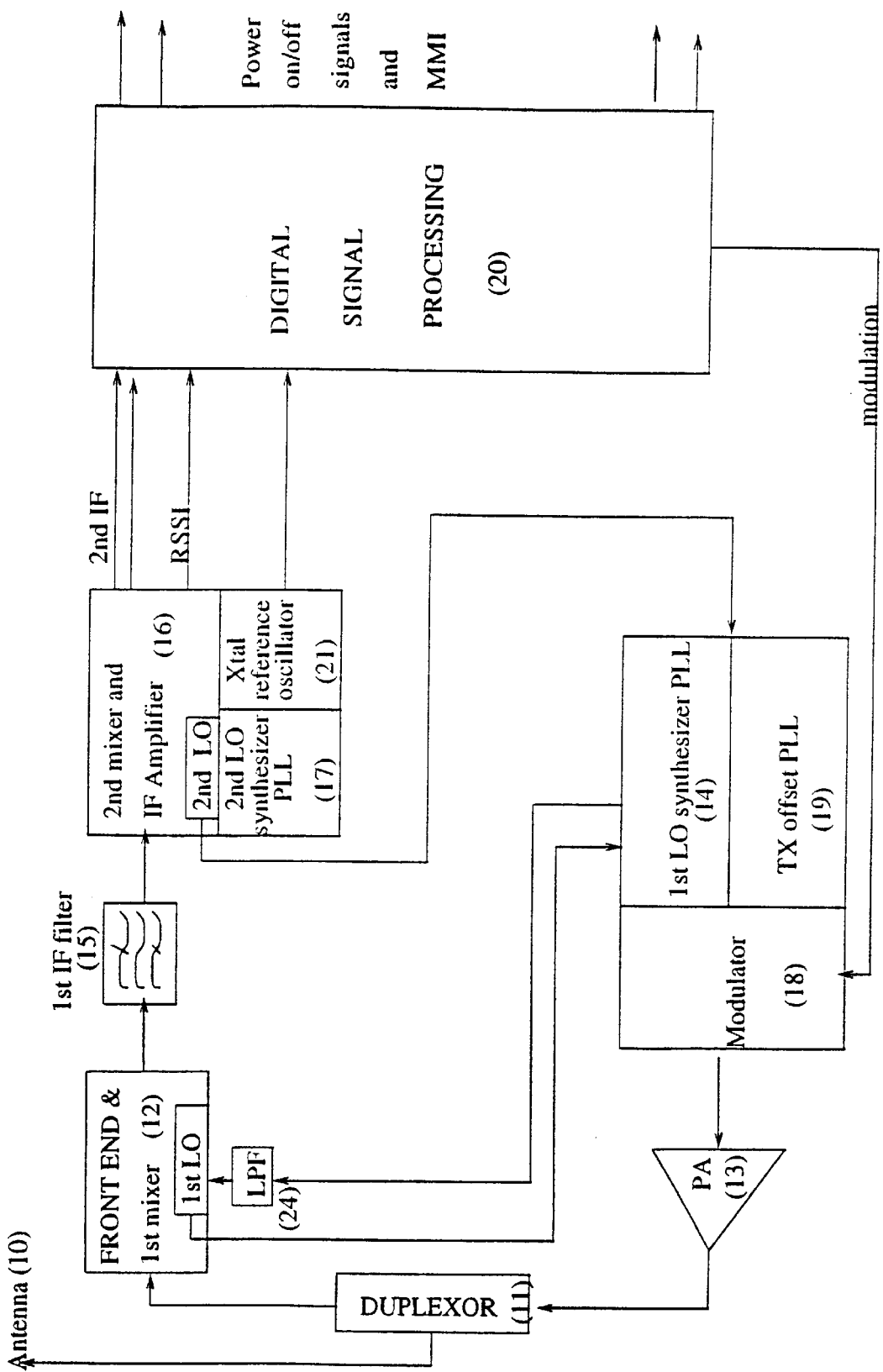
FIG. 4 illustrates a new inventive reference distribution scheme.

FIG. 4 shows one implementation of the invention. The two places to which the 1st LO signal is routed, that is the first LO PLL (14) and the TX offset PLL (19) are colocated with modulator circuit (18) in first (transmit) integrated circuit. Thus there is only a single 1st LO output connection from front end chip (12) to transmit chip (14,18,19).

However, when two synthesizer PLLs are colocated on the same chip, they should produce output pulses at different times. This is difficult or impossible to arrange if the two phase comparators have independent reference frequency sources, such as when the second LO is used for the TX offset PLL reference and the crystal is used as the first LO reference. Therefore, according to this invention the second LO is also used as the reference for the first LO synthesizer PLL. Moreover, as will be shown below, there are numerical advantages in using the second LO as the reference source for the first LO, particularly when it is desired to construct dual-band/dual-mode radios. Thus, a single reference input from 2nd LO part of IF chip (16) is provided for both PLLs (14) and (19).

Crystal oscillator circuit (21) is now combined with 2nd LO PLL and IF circuit (16) so that the reference signal from oscillator (21) to PLL (17) is an internal connection only. Likewise, the 2nd LO signal to its controlling PLL (17) is an internal signal only. The only remaining external signal is from reference oscillator (21) to digital processing (20).

The radio frequency oscillator signal distribution has now been reduced to the following signals:

1) 1st LO signal from frontend (12) to PLLs (14 & 19);
2) Crystal reference frequency from oscillator (21) to processing (20); and
3) 2nd LO from IF chip (16) to TX offset PLLs (14 & 19).

It would have been equally conceivable to place crystal oscillator (21) into digital processing chip (20), however, the oscillator (21) is more logically associated with other analog/RF circuits that use the same integrated circuit fabrication processes, and is therefore envisioned to be preferably integrated with IF chip (16,17,21). It is possible that in some applications a Very High Frequency (VHF) crystal, such as an overtone crystal, could be used directly to control the frequency of the second local oscillator without the use of a digital frequency synthesizer PLL circuit; however, VHF overtone crystals are more difficult to adjust to a desired oscillation frequency than fundamental-mode crystals, so a fundamental-mode crystal reference oscillator with a digital PLL is preferred.

Figure 5:
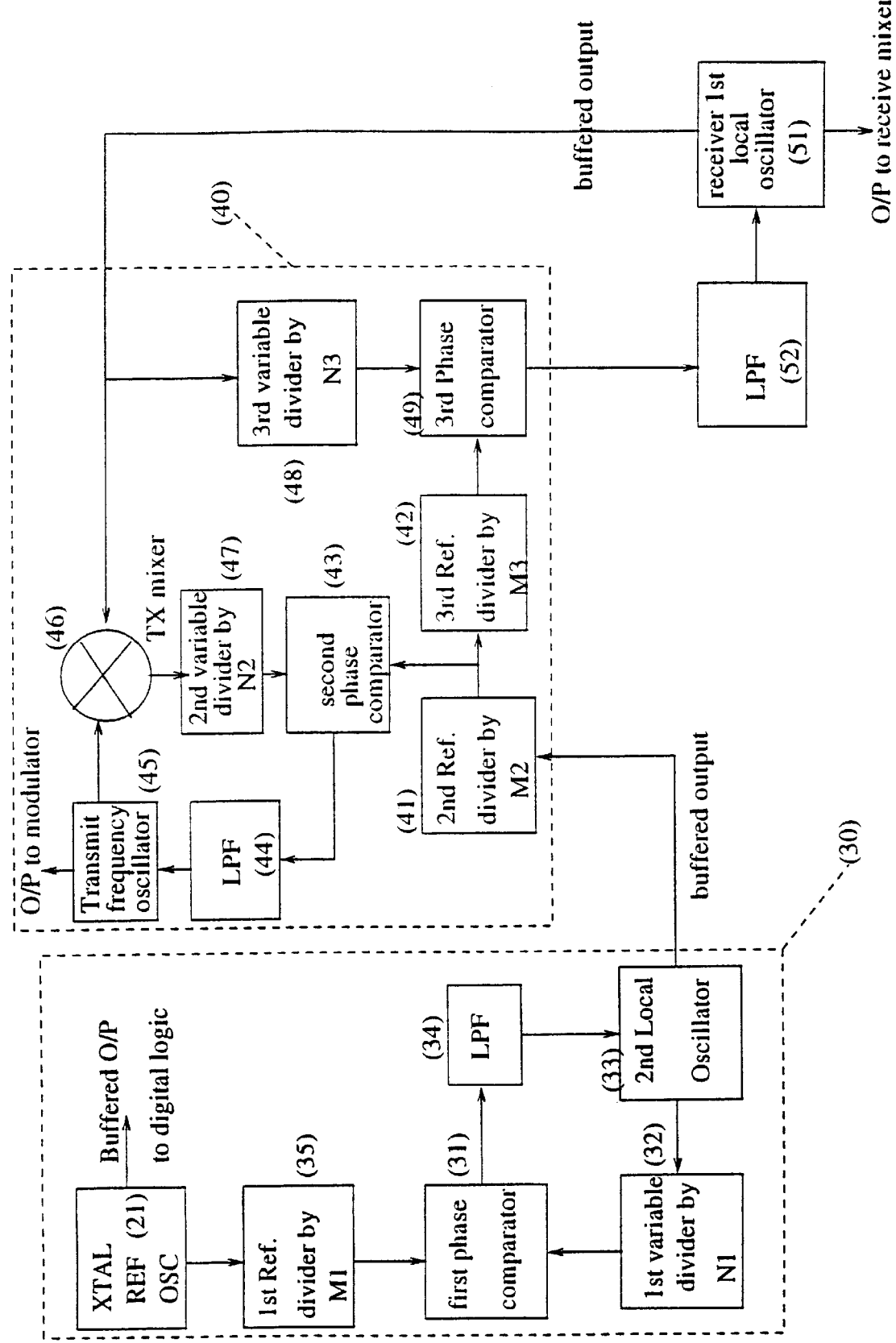
FIG. 5 illustrates more detail of the inventive frequency synthesis scheme.

FIG. 5 gives more details of the reference frequency distribution and frequency synthesis arrangements according to the inventive block diagram of FIG. 4.

The basic source of an accurate frequency reference in the apparatus is quartz crystal resonator (22) of FIGS. 1–4, connected to oscillator circuit (21). Even a quartz crystal cannot provide the necessary accuracy required for cellular phones operating in the 2 GHz region of the radio spectrum, and therefore means contained within digital processing (20) determine the receiver frequency error relative to signals received from land-based network stations or satellite relays, which error is ascribed to crystal (22), and an adjusting signal is sent to frequency adjustment components (such as a varactor diode for example) connected to crystal (22) so as to annul the error.

In FIG. 5, the oscillator circuit (21) is incorporated in IF chip (30) along with second local oscillator (33) and its control PLL comprising reference divider (35), first variable divider (32), phase comparator (31) and loop filter (34). The crystal oscillator signal is divided in frequency by counter/divider (35) which divides by a first integer M1 to produce a phase comparison frequency $F_{ref}/M1$, where $F_{ref}$ is the crystal frequency. The second local oscillator signal is divided in frequency by an integer N1 in first variable divider (32), to produce a second phase comparison signal, which is compared with the phase comparison frequency signal from divide-by-M1 circuit (35) to produce a phase and frequency error signal from first phase comparator (31). The phase error signal is filtered and integrated using loop filter (34) to produce a frequency control signal to 2nd local oscillator (33) free of comparison frequency ripple. The higher the comparison frequency from divider (35), the easier it is for loop filter (34) to eliminate this unwanted ripple while otherwise maintaining a fast speed of response to correct unwanted fluctuations of the 2nd LO's frequency due to noise or vibration, for example. Therefore an objective of the invention is to obtain a high comparison frequency, that is a low reference divide ratio M1. The second local oscillator frequency is thus accurately controlled to equal $F_{ref}.N1/M1$.

According to Dolman's prior invention and the current invention, a buffered second local oscillator signal is output from 2nd LO (33) to be used as a reference for other frequency generation, in particular the transmit offset frequency (according to Dolman's prior application referenced above) and now also the first local oscillator frequency according to this invention. Since both the TX offset and 1st LO synthesizer PLL circuits are to be colocated in transmit signal generation chip (40) in order to reduce distribution of the second LO signal to a single cross-board connection, it is desirable that the phase comparators of the respective PLLs should pulse at different times separated as far as possible within some longest common period. This ensures that when one charge-pump phase comparator receives a current pulse from the supply, the other charge pump is in its tristate, that is, a high impedance state or open circuit output, with no current flowing to its respective loop filter. This minimizes the risk of interference from one charge pump to the other. The design and operation of charge pump phase detectors is described more fully in above-incorporated U.S. Pat. No. 5,095,288.

In order to provide the preferred out-of-phase relationship between the charge pumps (43,49), internal frequency plans are sought in which the phase comparison frequency for the TX offset loop is an integer multiple M3 of the phase comparison frequency for the first LO. Since the second LO frequency is also, according to Dolman's incorporated application, an integer M2 times the TX offset reference, the first LO comparison frequency must now be related to the second LO frequency divided by M2.M3.

Thus the second LO frequency signal is input from IF chip (30) to TX chip (40) and divided by integer M2 in a second reference divider (41) to obtain the phase reference to TX offset phase comparator (43) according to Dolman as $$F_{LO2}/M2 = F_{ref}N1/(M1.M2)$$

This frequency is then further divided in third reference divider (42) by integer M3 in order to obtain the phase comparison frequency for first LO phase comparator (49). Moreover, divider M3 and phase comparator (43) are arranged to respond to opposite edges of the output of divider M2, for example one responding to a rising edge (low voltage or '0' state transitioning to high voltage or '1' state) while the other responds to a falling edge (1 to 0 transition). This ensures that they respond one half cycle apart in time of their lowest common multiple frequency at the output of divider (41).

The phase comparison rate for charge pump phase comparator (49) is thus $$F_{ref}.N1/(M1.M2.M3).$$

This frequency is compared with the 1st LO frequency from first LO (51) divided down by a factor N3 in third variable divider (48), to produce a frequency and phase error signal from comparator (49) which is filtered in loop filter (52) to obtain a feedback control signal to control oscillator (51) to the desired 1st LO frequency $$F_{ref}.N3.N1/(M1.M2.M3)$$

Preferably, N3 is not an integer factor but comprises a whole part and a fractional part, the components (48,49 and 52) of the first LO PLL forming a fractional-N synthesizer according to above-incorporated Patent No. 5,180,993. Optionally, both M3 and N3 can be varied in a pattern generated by a fractional-(N,M) controller according to U.S patent application No. 08/957,173 entitled "Frequency Synthesis by Sequential Fraction Approximations" (Dent, filed Oct. 24, 1997) which is hereby incorporated by reference. Both the fractional-N and the fractional-(N,M) techniques have the desirable effect of allowing the 1st LO phase comparison frequency to be higher than the desired tuning step size, thus making it easier for the loop filter (52) to filter out unwanted comparison frequency ripple while otherwise maintaining a fast control loop response to correct errors.

The transmitter frequency signal, when transmission is required, is generated by transmit frequency oscillator (45). A transmit frequency signal from oscillator (45) is mixed in TX mixer (46) with a first LO signal from first LO (51). The first LO signal preferably comes from receive chip (12) via a single cross board connection to minimize RF tracks. A single cross board connection for any of the interchip signals mentioned can nevertheless be a balanced connection comprising two tracks driven in antiphase, as balanced connections to and from RF chips at high frequencies reduce unwanted stray coupling and radiation effects.

TX mixer (46) mixes the transmit frequency and the 1st LO frequency to produce a difference frequency signal at the TX offset frequency $F_{txoff}$. The difference frequency signal output from mixer (46) may be low-pass filtered to ensure the original, higher input frequencies are removed, and then drives second variable divider (47) which divides by a factor N2. The output signal at frequency $F_{txoff}/N2$ is then compared in second phase comparator (43) with the phase reference from divider (41) to produce a frequency and phase error signal. The error signal from comparator (43) is filtered and integrated in loop filter (44) to produce a control signal which controls TX oscillator (45) until the desired TX-offset frequency is accurately achieved. Thus the TX offset frequency is given by $$F_{txoff}/N2 = F_{ref}N1/(M1.M2), \text{ or } F_{txoff} = F_{ref}N2.N1/(M2.M1)$$

It is possible for the TX offset PLL comprising components (41,43,44,45,46,47) also to be a fractional-N synthesizer, however fractional-N synthesizers are more complex than integer synthesizers and thus it is desired to avoid having more than one in the apparatus. Thus, factor N2 is preferably an integer.

Obtaining the highest possible phase comparison frequencies for phase comparators (31,43,49) is rarely a problem in single-band radios having a single duplex spacing between transmit and receive frequency channels. It is more difficult first in the context of two-band radios that must operate with more than one duplex spacing. Therefore two-band radio designs according to the invention will now be described with the aid of FIGS. 6,7,8 and 9.

Figure 6:
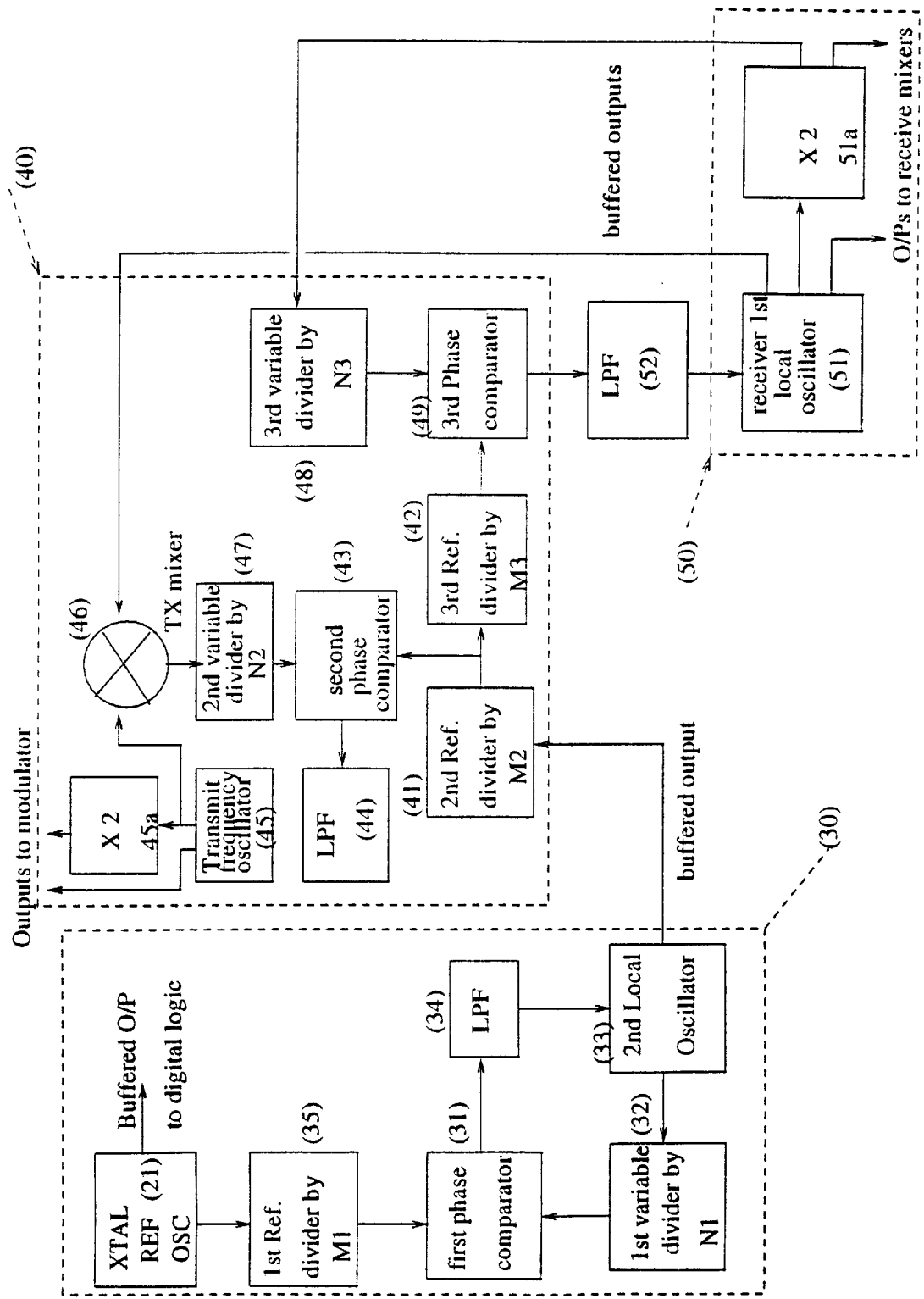
FIG. 6 illustrates an inventive dual band scheme using frequency doublers

A two-band radio according to FIG. 6 would comprise a transmit frequency oscillator (45) for generating transmit frequencies in the lower of the two possible transmit frequency bands, A frequency doubler (45a) is then used to double the frequency when operation in the higher of the two frequency bands is desired, the lower and higher bands being approximately one octave apart. An output from the oscillator (45) directly is used to drive the modulator when lower-band operation is required while an output from the doubler (45a) is used when operation at the higher band is desired. However, as indicated in FIG. 6, the lower frequency direct from oscillator (45) enters TX mixer (46).

Likewise, first local oscillator (51) operates on a frequency adapted to the lower of the two-possible receive frequency bands to convert received signals to the desired first Intermediate Frequency; the signal from first LO (51) is doubled in frequency using doubler (51a) when operation in the higher of the two receive frequency bands is desired, the LO frequency for the higher band being approximately an octave higher than that for the lower band. This approximation can be manipulated to be a close approximation by suitable choice of the first Intermediate frequency and by suitable choice of either high-side or low-side mixing in front-end chip (12).

For example, for low-band receive operation, we have
$F_{lo1}(lo)=F_{rx}(lo)+F_{if1}$ for high-side mixing or
$F_{lo1}(lo)=F_{rx}(lo)-F_{if1}$ for low side mixing, where
   $F_{lo1}(lo)$ is the low-band first LO frequency,
   $F_{rx}(lo)$ is the low-band receive channel frequency and
   $F_{if1}$ is the chosen first intermediate frequency.
Likewise $F_{lo1}(hi)=F_{rx}(hi)+F_{if1}$ for high-side mixing or
$F_{lo1}(hi)=F_{rx}(hi)-F_{if1}$ for low side mixing, where
   $F_{lo1}(hi)$ is the high-band first LO frequency,
   $F_{rx}(hi)$ is the high-band receive channel frequency and
   $F_{if1}$ is the same chosen first intermediate frequency as for low-band.
Thus, for $F_{lo1}(hi)$ to be twice $F_{lo1}(lo)$, we have $$F_{rx}(hi)+/-F_{if1}=2(F_{rx}(lo)+/-F_{if1})$$

giving $F_{if1}=F_{rx}(hi)-2F_{rx}(lo)$ (for both optional signs '+') (1)

or $F_{if1}=(F_{rx}(hi)-F_{rx}(lo))/3$ ('−' in high band and 1+1 in low) (2)

or $F_{if1}=2F_{rx}(lo)-F_{rx}(hi)$ (for both optional signs
or $F_{if1}=(2F_{rx}(lo)-F_{rx}(hi))/3$ ('+' in high band and 1−1 in low)

The latter two equations give negative results which is impossible. A possible alternative is to make the first LO range at high band triple the first LO range at low band, giving $$F_{if1}=(3F_{rx}(lo)-F_{rx}(hi))/2 \text{ (for both optional signs '−')} \quad (3)$$

$$F_{if1}=(3F_{rx}(lo)-F_{rx}(hi))/4 \text{ (for '+' in high band and in low)} \quad (4)$$

Examples of preferred internal frequency plans for a radio according to FIGS. 4 and 5, operating according to the IS54 "D-AMPS" single-band standard, will now be described. A search of frequency plans giving the highest possible phase comparison frequencies at phase comparators (31,43 and 49) yielded, among others, the results:

| 1ST IF | 2ND LO | TX OFFSET | M1 | N1 | M2 | N2 | M3 | 1ST LO FRAC-N MODULUS |
|---|---|---|---|---|---|---|---|---|
| 101.64 | 101.52 | 146.64 | 9 | 47 | 9 | 13 | 47 | 8 |

The above results provide phase comparison frequencies of $F_{xtal}/M1=19.44/9=2.16$ MHz for 2nd LO phase comparator (31);

$F_{lo2}/M2=101.52/9=11.28$ MHz for TX offset phase comparator (43), and $F_{lo2}/(M2.M3)=11.28/47=240$ KHz for 1st LO phase comparator (49). The first LO tuning steps are reduced from the above 240 KHz to 30 KHz by employing a fractional-N divider for N3 giving steps of ⅛th, i.e. the fractional-N modulus is 8.

The above solution provides a high TX offset phase comparison frequency of 11.28 MHz. Other criteria might be to obtain the highest 2nd LO phase comparison frequency. An alternative result for which the 2nd LO is just a harmonic of the crystal is for example:

| 1ST IF | 2ND LO | TX OFFSET | M1 | N1 | M2 | N2 | M3 | 1ST LO FRAC-N MODULUS |
|---|---|---|---|---|---|---|---|---|
| 116.76 | 116.64 | 161.76 | 1 | 6 | 243 | 337 | 1 | 16 |

The above values result in a 2nd LO phase comparison frequency of 19.44 MHz at phase comparator (33), and divider (35) is not necessary because M1=1. The transmit offset and first LO phase comparators (43,49) both operate at 480 KHz, and divider (42) may be omitted as M3=1. The first LO tuning steps are reduced from 480 KHz to 30 KHz by employing a modulus 16 fractional-N divider (48) allowing N3 to be varied in steps of ¹⁄₁₆th.

Attention is now turned to dual-band radios with internal frequency reference distribution according to FIG. 6. The above two exemplary solutions were illustrated because they are also compatible with a dual-band radio operating according to the dual-band D-AMPS standard IS136. Solutions for dual-band radios are given in the tables below for cases where the first local oscillator is on the high side for 800 MHz band operation and on the low side for 1900 MHz band operation, and the second IF is fixed at 120 KHz.

Table 1 illustrates solutions in which the 2nd LO is a harmonic of the crystal, that is the second LO has the highest possible phase comparison frequency, M1 being equal to unity.

TABLE 1

Dual band 800(1900) solutions with 2nd LO a crystal harmonic

| 1st IF | 2nd LO | TX OFFSET | M1 | N1 | M2 | N2 | M3 | 1st LO modulus |
|---|---|---|---|---|---|---|---|---|
| 116.76 | 116.64 | 161.76(36.72) | 1 | 6 | 243(54) | 337(17) | 1(9 or 3) | 16(8 or 24) |
| 155.64 | 155.52 | 200.64(75.6) | 1 | 8 | 162(72) | 209(35) | 1(9 or 3) | 32(8 or 24) |
| 194.52 | 194.4 | 239.52(114.48) | 1 | 10 | 405(90) | 499(53) | 1(9 or 3) | 16(8 or 24) |
| 233.4 | 1233.28 | 278.4(153.36) | 1 | 12 | 243(108) | 290(71) | 1(9 or 3) | 32(8 or 24) |

When using the figures in table 1 above to determine the phase detector comparison frequencies for TX offset phase comparator (43), it must be taken into account that the arrangement in FIG. 6 controls the TX oscillator (S1) frequency BEFORE doubling to 1900 MHz in doubler (51a).

Therefore, phase comparator (43) must operate at half the frequency provided by divider (41) and the indicated value of M2.

Thus, either phase comparator (43) must contain a further divide by two circuit to halve the frequency from divider (41) when operating in the 1900 MHz band, or else the value of M2 for 1900 MHz must be doubled.

In the latter case, the value of M3 for 1900 MHz operation must be halved (which is impossible as M3 is always odd at 1900 MHz), or else the fractional modulus for 1900 MHz operation must be halved. The latter is preferable and so the preferred fractional-modulus at 1900 MHz is 4 or 12 combined with an M2 value double that shown in table 1 for 1900 MHz operation. The TX offset phase comparison frequency at phase comparator (43) is thus 1080 KHz for 1900 MHz operation and not 2160 KHz as would be obtained by dividing the second LO frequency in table 1 by the indicated values of M2.

Furthermore, note that in FIG. 6 it is always the doubled frequency from doubler (S1a) that is fed to fractional-N first-LO synthesizer loop beginning with variable divider (48) for N3. Since the frequency used for the receiver mixer during 800 MHz band operation is half of the synthesized frequency, the synthesizer need only provide 60 KHz steps in order to tune the receiver in 30 KHz steps. Thus the fractional-N modulus shown in table 1 for 800 MHz operation may be halved.

It may be desirable to operate in both bands using the same fractional-N modulus, and this may always be accomplished by use of a modulus which is the lowest common multiple of the 800 MHz and 1900 MHz moduli, accepting that the frequency steps in one or both bands may then be finer than needed, it being acceptable to exceed the required frequency resolution.

Figure 7:
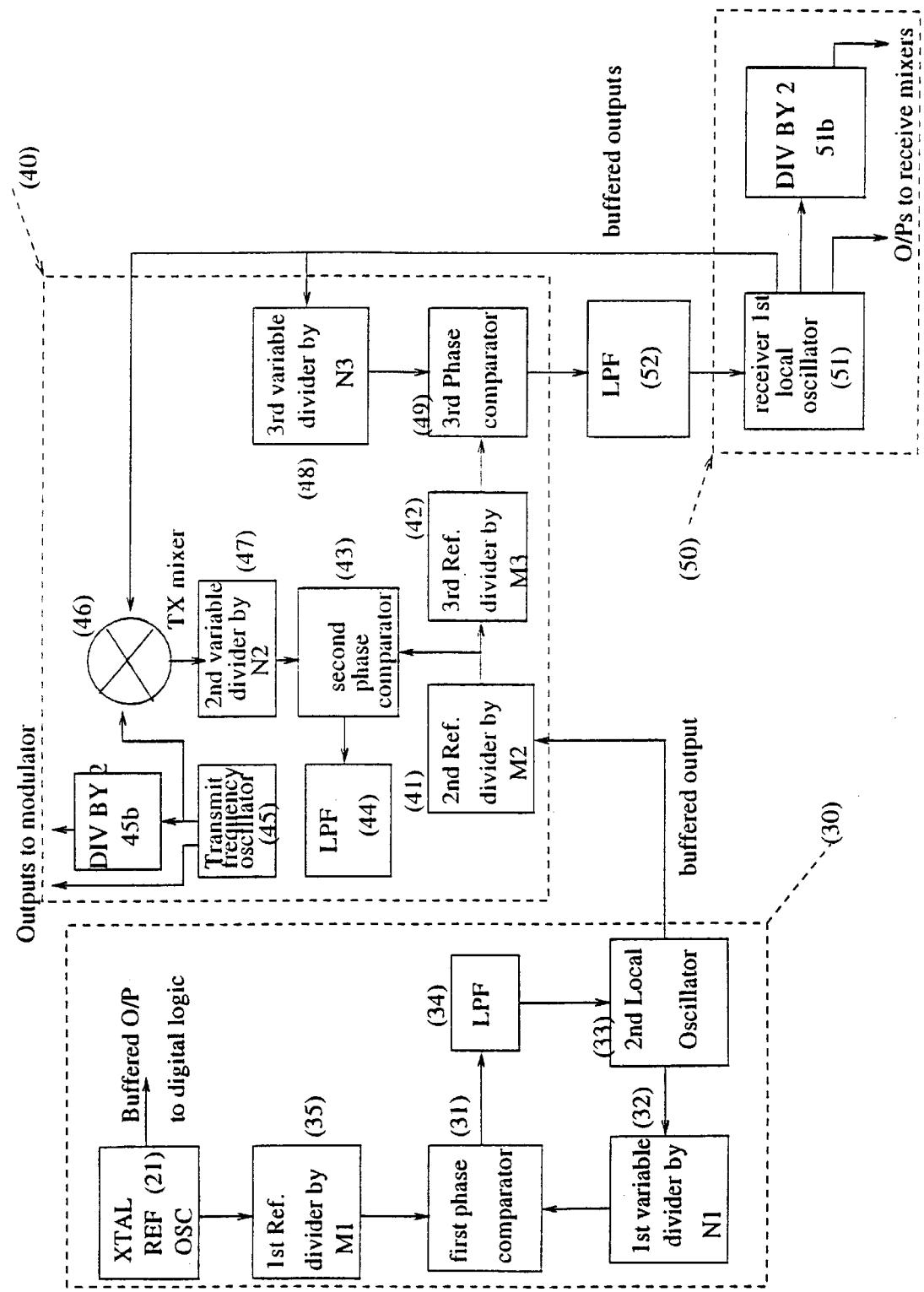
FIG. 7 illustrates an inventive dual band scheme using frequency halvers.

The above issues are one motivation for considering frequency halving circuits (45b,S1b) in FIG. 7 as opposed to frequency doubling circuits (45a,51a) of FIG. 6. Another motivation is that phase noise is doubled by frequency doubling circuits but halved by frequency halving circuits. Thus there is an expectation of lower unwanted phase noise and ripple when using frequency halving circuits. Yet another motivation is that a frequency doubling circuit requires a filter to remove unwanted leakage of the fundamental, as well as other unwanted higher harmonics; the output of a frequency divide-by-2 circuit is however relatively free of other unwanted spectral components.

Referring now to FIG. 7, it is seen that it is the non-divided output of oscillator (S1) which is fed to the TX offset synthesizer loop beginning with mixer (46). Therefore the phase comparator for 800 MHz band operation must operate at double the frequency implied by table 1, i.e. the value of M2 must be halved, alternatively the value of N2 must be double that shown in table 1 for 800 MHz operation. The former is not possible for cases where M2 is odd, but is possible when the first IF is 155.64 MHz and M2=162. Thus, when table 1 is applied to FIG. 7, the values of N2 for 800 MHz should be doubled except in the case of first IF=155.64 MHz, in which case a better option is to halve M2 to 81; then it is necessary to double the value of M3 (to two) for 800 MHz operation in order to maintain the same 1st LO phase comparison frequency at phase comparator (49), alternatively to increase the fractional-N modulus from 32 to 64. On the other hand, since the frequency of oscillator (51) is halved before use in the receiver for 800 MHz operation, it is sufficient that oscillator (51) be tuned in 60 KHz steps, allowing the fractional-N modulus to be halved again back to 32.

Figure 8:
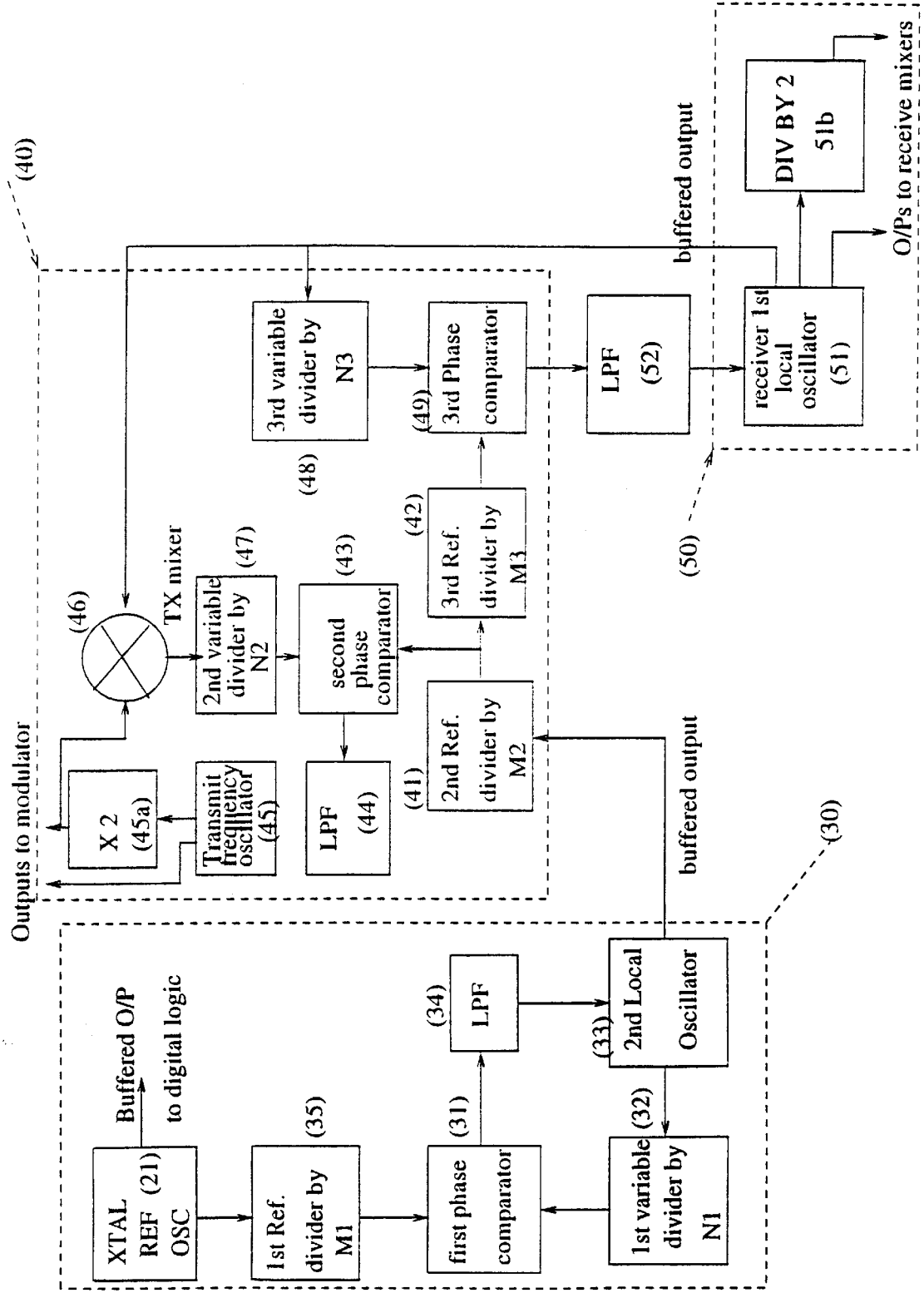
FIG. 8 illustrates an inventive scheme using one frequency halver and one frequency doubler.
Figure 9:
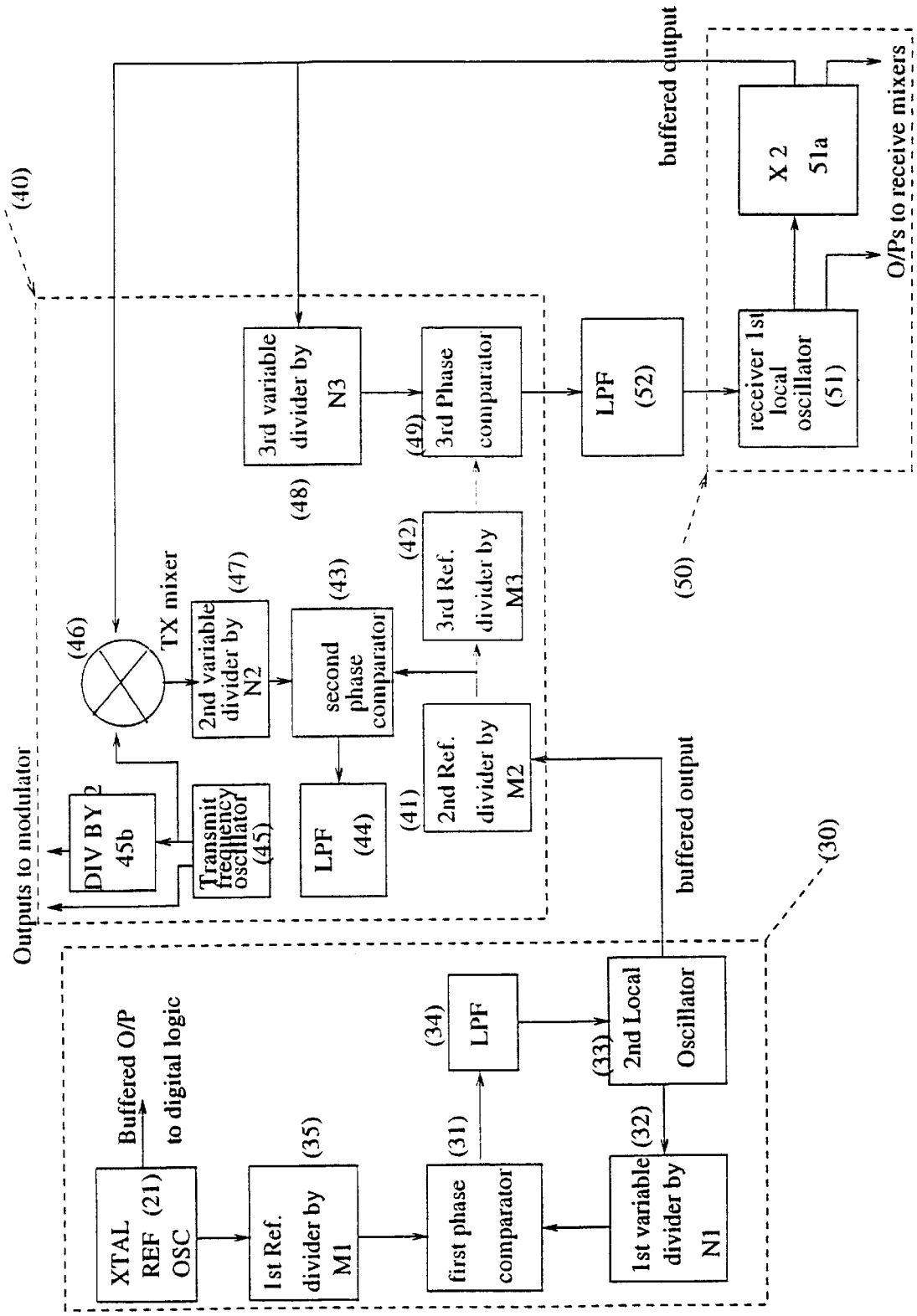
FIG. 9 illustrates an inventive scheme in which the frequency halver and the frequency doubler are switched in position.

The above considerations with respect to FIG. 7 also apply to the arrangement of FIGS. 8 and 9, in which the TX frequency signal and the first LO are always controlled at the higher frequency and halved for 800 MHz use.

In choosing between the implementations of FIGS. 6,7,8 and 9, another motivation is power consumption. In FIG. 6, the x2 circuit 51a must be powered up during 800 MHz band receive operation, which has most impact on standby time before the battery must be replenished. Still, the x2 circuit 45a need only be powered up for 1900 MHz transmission, thus saving power in 800 MHz band transmission. In FIG. 7, divider 51b need only be powered up for 800 MHz reception, and may be powered down for 1900 MHz reception. Divide by 2 circuit 45b likewise need only be powered up for 800 MHz transmission and is not needed for 1900 MHz transmission.

In FIG. 8, x2 circuit 45a must be powered up for transmission in either frequency band, but this is of little consequence as the power amplifier (13) dominates transmit power consumption. Divide by 2 circuit 51b may be powered down during 1900 MHz receive. In FIGS. 6 and 9, x2 circuit 51a must always be powered up for reception in either frequency band. Therefore this is not as desirable for standby battery life at 1900 MHz as FIGS. 7 or 8.

1900 MHz D-AMPS operation uses TDMA, which affords much longer standby times due to a low receive duty factor. 800 MHz operation however includes the analog FM AMPS mode, in which receive standby duty factor is longer. The 800 MHz AMPS operation is therefore the limiting factor for battery life and we are therefore led to consider FIG. 10, in which the first LO is always controlled at the lower frequency, allowing doubler 51A to be powered down during 800 MHz reception.

Figure 10:
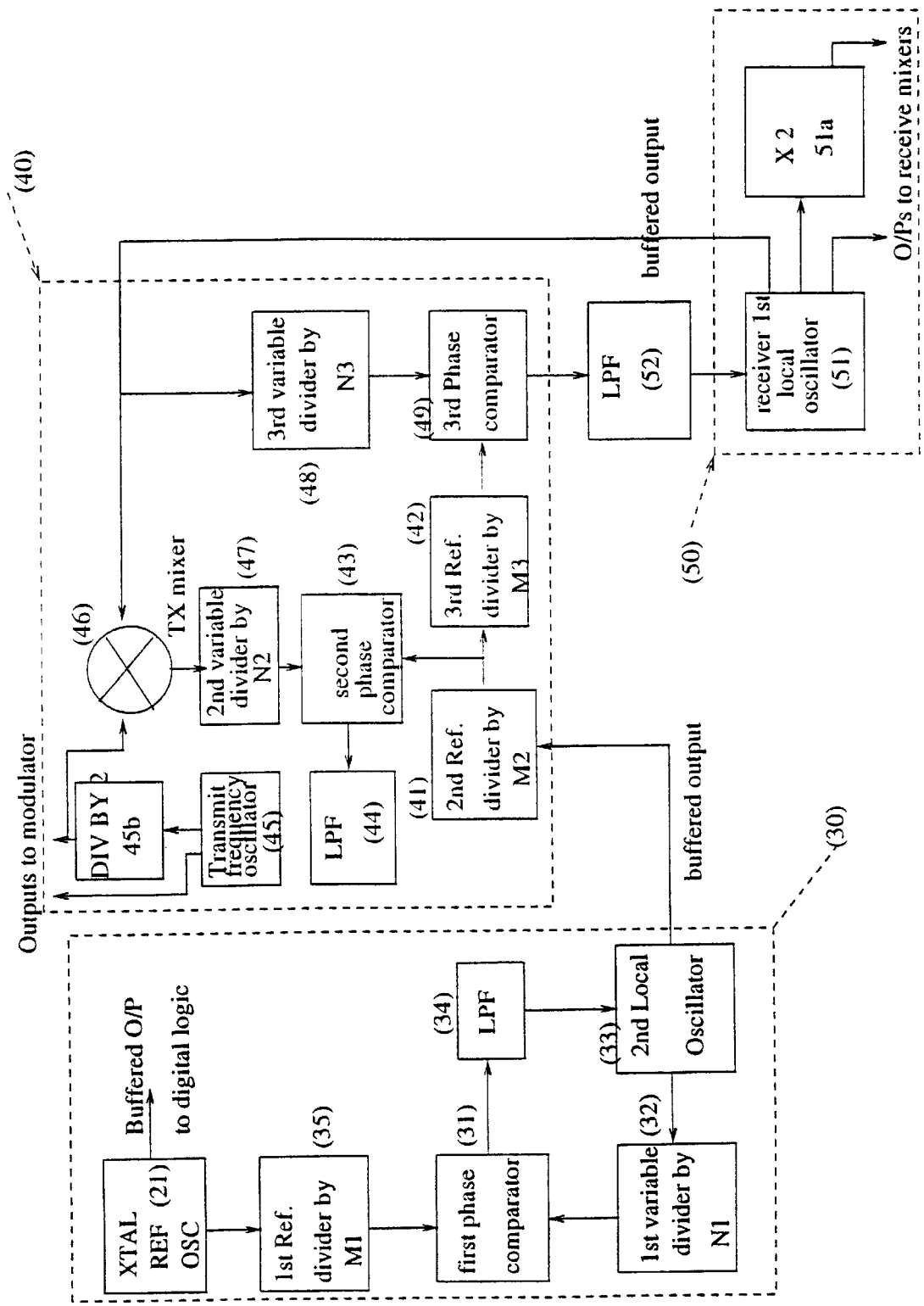
FIG. 10 illustrates an inventive scheme in which a frequency doubler can be powered down for AMPS reception.
Figure 11:
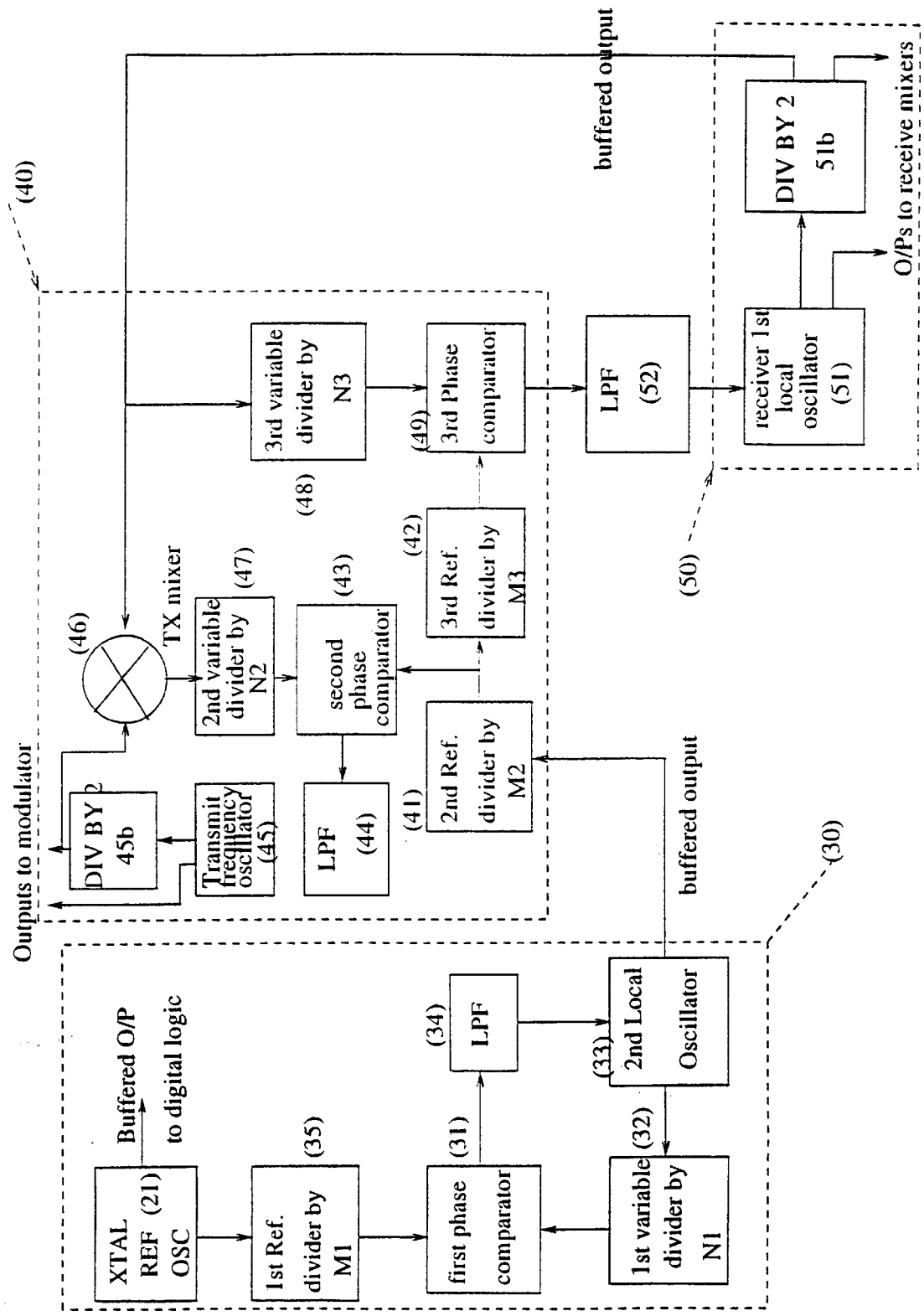
FIG. 11 is a modification of FIG. 10, using frequency halvers.

Referring to FIG. 10, the first LO is always controlled at the lower 800 MHz operation. A disadvantage, however, is that the oscillator 51 must be tuned in 15 KHz steps in order to provide 30 KHz steps at 1900 MHz, requiring the fractional-N modulus to be doubled, which is undesirable. Taking into account that a divide-by-2 circuit in present semiconductor technology consumes very little power, and likely less than a frequency doubler circuit, together with the other advantages outlined above for frequency halving rather than frequency doubling, FIG. 7 is likely to be the best practical implementation.

The above Table 1 listed solutions for which the second LO was a harmonic of the crystal, giving the lowest value of unity for divider (35). Table 2 lists solutions in which 2nd LO phase comparator (31) operates at 6.48 MHz, which is the crystal frequency divided by 3 (M1=3).

TABLE 2

Dual band 800(1900) with 2nd LO a multiple of crystal/3

| 1st IF | 2nd LO | TX OFFSET | M1 | N1 | M2 | N2 | M3 | 1st LO modulus |
|---|---|---|---|---|---|---|---|---|
| 90.84 | 90.72 | 135.84(10.8) | 3 | 14 | 189(42) | 283(5) | 1(9 or 3) | 16(8 or 24) |
| 103.8 | 103.68 | 148.8(23.76) | 3 | 16 | 108(48) | 155(11) | 1(9 or 3) | 32(7 or 24) |
| 129.72 | 129.6 | 174.72(49.68) | 3 | 20 | 1135(60) | 182(23) | 1(9 or 3) | 32(8 or 24) |
| 142.68 | 142.56 | 187.68(62.64) | 3 | 22 | 297(66) | 391(29) | 1(9 or 3) | 16(8 or 24) |
| 168.6 | 168.48 | 213.6(88.56) | 3 | 26 | 351(78) | 445(41) | 1(9 or 3) | 16(8 or 24) |
| 1181.56 | 181.44 | 226.56(101.52) | 3 | 28 | 189(84) | 236(47) | 1(9 or 3) | 32(8 or 24) |
| 207.48 | 207.36 | 252.48(127.44) | 3 | 32 | 216(96) | 263(59) | 1(9 or 3) | 32(8 or 24) |
| 220.44 | 220.32 | 265.44(140.4) | 3 | 34 | 459(102) | 553(65) | 1(9 or 3) | 16(8 or 24) |

There are also many solutions with the 2nd local oscillator a multiple of 2.16 MHz (crystal/9, i.e. M1=9), or 720 KHz (crystal/27 or M1=27), and at least one solution with M1=6. Table 3 below only lists other solutions that have particularly interesting characteristics such as high comparison frequencies for TX offset comparator (43) in either 800 MHz or 1900 MHz operation.

TABLE 3

Other solutions of particular interest

| 1st IF | 2nd LO | TX OFFSET | M1 | N1 | M2 | N2 | M3 | 1st LO modulus |
|---|---|---|---|---|---|---|---|---|
| 152.4 | 152.28 | 197.4(72.36) | 6 | 47 | 27(141) | 35(67) | 47(3) | 4(12) |
| 101.64 | 101.52 | 146.64(21.6) | 9 | 47 | 9(47) | 13(10) | 47(9 or 3) | 8(8 or 24) |
| 159.96 | 159.84 | 204.96(79.92) | 9 | 74 | 333(2) | 427(1) | 1(333 or 111) | 16(8 or 24) |
| 203.16 | 203.04 | 248.16(123.12) | 9 | 94 | 9(94) | 11(57) | 47(9 or 3) | 16(8 or 24) |
| 106.68 | 106.56 | 151.68(26.64) | 27 | 148 | 111(4) | 158(1) | 1(111 or 37) | 32(8 or 24) |
| 213.24 | 213.12 | 258.24(133.2) | 27 | 296 | 222(8) | 269(5) | 1(111 or 37) | 32(8 or 24) |

The above solutions are remarkable for their relatively low values of (M2,N2) in one or other frequency band, giving very high TX offset phase comparison frequencies in those cases.

As described above, it is of interest that the first local oscillator in the higher frequency range should tune over a range approximately equal to twice the range of frequencies needed for operation in the lower band.

The receive frequency range for the 800 MHz cellular band is 869.04 to 893.97 MHz, while the receive frequency range of the 1900 MHz PCS bands is 1930.08 to 1990.08 MHz. Substituting into equations (1),(2),(3) and (4) above gives desirable first intermediate frequencies of 192 MHz, 64 MHz, 338.52 MHz and 169.26 MHz respectively. The 64 MHz IF is too low to provide sufficient image rejection when operating over the 60 MHz wide 1900 MHz receive band. The 338.52 MHz IF is difficult to choose because of the unavailability of SAW or crystal filters with a 30 KHz bandwidth at that frequency. The solution of equation (1) or equation (4) is therefore preferred.

All the above solutions in tables 1–3 were for 1st LO high at 800 MHz and low at 1900 MHz, i.e. for the solution of equation (2). These can be employed providing the range of the local oscillator (51) is band-switched between 800 MHz and 1900 MHz operation. It can be undesirable to attempt to cover in one band the entire tuning range that would be required for operation at both 800 and 1900 MHz.

A search for solutions for the case of equation (1) yielded the following result with the closest first IF to 192 MHz:

| | | |
|---|---|---|
| 1st IF | 189.96 MHz | |
| 2nd LO | 190.08 MHz = 88/9 × the 19.44 MHz crystal | (N1 = 88, M1 = 9) |
| TX offset (800 MHz) | 234.96 MHz = 89/72 × 2nd LO | (N2 = 89, M2 = 72) |
| TX offset (1900 MHz) | 270.00 MHz = 125/88 × 2nd LO | (N2 = 125, M2 = 88) |
| TX offset comparison frequency AT 800 MHz = 2640 KHz | | |
| (actually 5280 KHz for the arrangement of FIG. 7, with N2 = 89,M2 = 36) | | |
| TX offset comparison frequency at 1900 MHz = 2160 KHz | | |
| 2nd LO comparison frequency = 2160 KHz | | |

-continued

| Possible 1st LO fractional-N moduli: 1,2,4,8,11,22,44 or 88 | 800 MHz) |
| and: 1,2,3,4,6,8,9,12,18,24,36 or 72 | (1900 MHz) |

The first LO phase comparison frequency is for example 240 KHz if a fractional-N modulus of 8 is selected for both bands.

Alternatively, a fractional-N modulus of 24 may be selected to give 720 KHz phase comparison frequency at 1900 MHz, but the phase comparison frequency will still be 240 KHz at 800 MHz. The tuning step size at 800 MHz will be 10 KHz with the same modulus of 24, or even 5 KHz for the arrangement of FIG. 7. This is finer than the 30 KHz needed, but is acceptable. 240 KHz is an adequate comparison frequency for 800 MHz operation, and the higher comparison rate of 720 KHz is desirable for 1900 MHz operation where the oscillator phase noise is double that at 800 MHz.

A solution in accordance with equation (4) assumes division of the high-band first local oscillator frequency by 3 for 800 MHz operation. In other words, the divider (51b) of FIG. 7 must be changed from a divide-by-2 to a divide-by-3 circuit. It is also necessary then to change divider 45b to a divide by 3 circuit, in order for the transmit frequency steps at 800 MHz to be correct. This solution is not investigated further here, as it is not preferred for a dual-band IS136 cellular phone, and in any case is an obvious extension of the disclosed methods.

The invention can be used for dual-band/dual-mode radio telephones in which compatibility with AMPS and IS54 (DAMPS) is desired in the 800 MHz band together with compatibility with the PCS1900 (GSM-based) standard.

The problem to be solved is that a radio is normally designed for D-AMPS operation based upon the use of a 19.44 MHz crystal as the most convenient common multiple of the 24.3 KS/S transmission symbol rate, the 30 KHz channel spacing and the 8 KS/S voice digitization. On the other hand, a radio is normally designed for GSM, DCS1800 or PCS1900 operation based upon a 13 MHz crystal, which is the lowest common multiple of the transmission bitrate of 270.833 KB/S (13 MHz/48), the channel spacing of 200 KHz (13 MHz/65) and the 8 KS/S voice digitization rate. This makes it difficult to merely integrate a radio of one design with a radio of the other design, due to the increase in parts count. Therefore it is desired to find internal frequency plans that allow components to be designed that can operate from either crystal frequency, and as another objective it is desired to find reference frequency distribution schemes that will allow operation with the same crystal reference frequency in any of an AMPS mode at 800 MHz, a D-AMPS mode at 800 or 1900 MHz or a PCS1900 mode at 1900 MHz.

Figure 12:
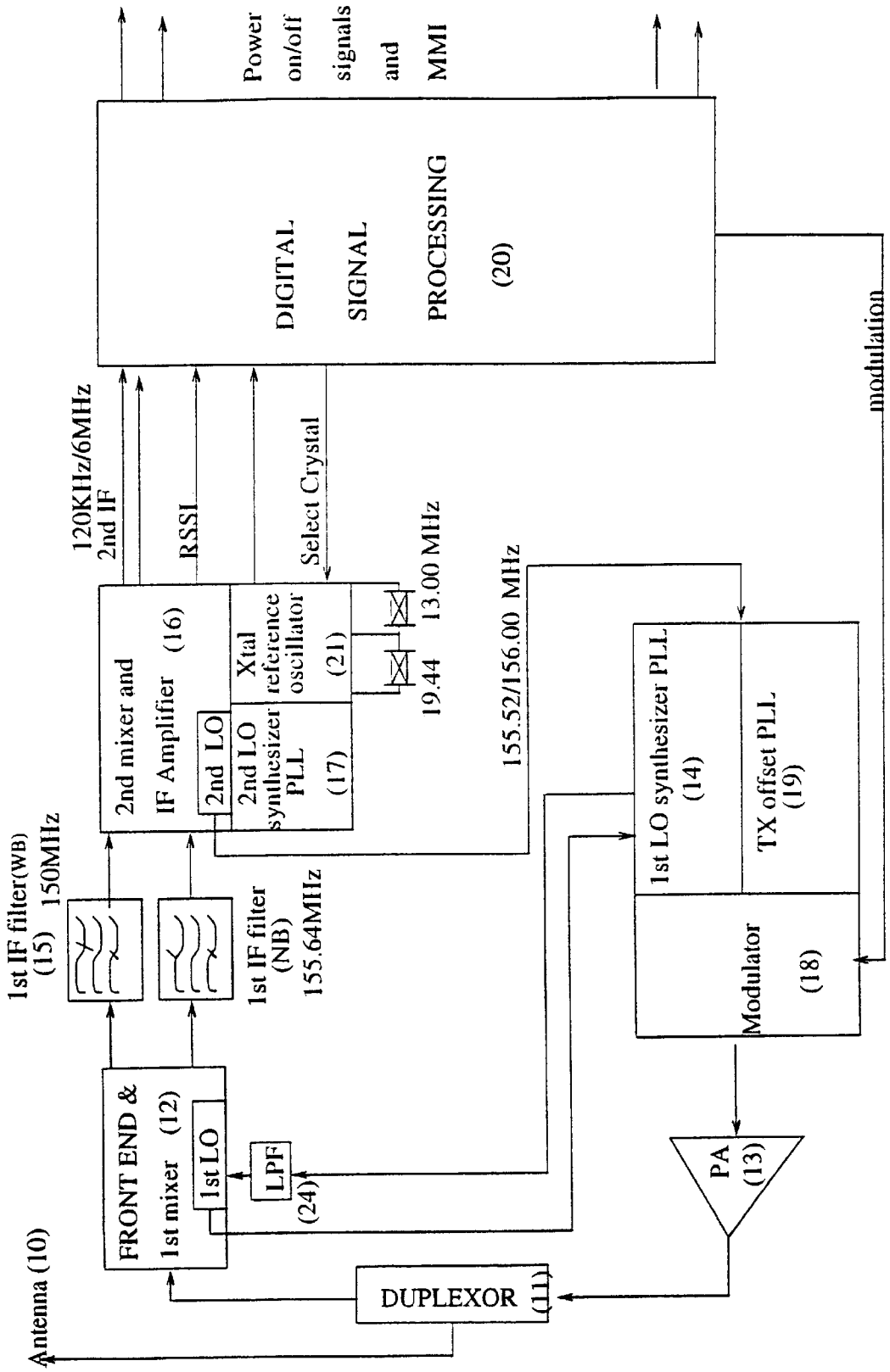
FIG. 12 illustrates an alternative reference frequency distribution for dual-mode radios

FIG. 12 illustrates a solution using both a 13 MHz and a 19.44 MHz crystal connected to reference oscillator (21), only one of which however is activated at a time via a "select crystal" control signal from digital logic (20).

A single intermediate frequency amplifier chip comprise a dual-crystal reference oscillator (21), second LO and its control PLL (17) and a dual-bandwidth second IF amplifier and second mixer (16). The reference oscillator operates in one mode at 13 MHz and the second LO is then controlled to 12×13 MHz. Alternatively, in a second mode, the reference oscillator operates at 19.44 MHz and the second LO is controlled to, for example, 155.52 MHz, which is sufficiently close to 156 MHz that the same oscillator can be used, while also being a multiple of 19.44 MHz (eight times 19.44 MHz).

The IF amplifier chip receives a downconverted signal from front end chip (12) which is filtered either using Wideband IF filter (15 WB) or Narrowband IF filter (15 NB). The filter center frequency in the wideband mode is 150 MHz, which mixes with the 2nd LO of 156 MHz in that mode to produce a second IF of 6 MHz, which is fed to digital signal processing (20) along with the RSSI signal. The narrowband first IF filter operates at a center frequency of 120 KHz higher than the second LO of 155.52, that is at 155.64 MHz, giving a second IF in the narrowband mode of 120 KHz, which is then fed to the signal processing chip (20). The second IF signal at either 120 KHz in the narrowband mode or 6 MHz in the wideband mode is preferably further filtered in IF amplifier (16) using second IF filters (not shown). In one implementation, the 120 KHz second IF filters are integrated active bandpass filters having a passbandwidth of approximately 30 KHz, and are fabricated as part of IF amplifier chip (16,17,21). The 6 MHz 2nd IF filtering is performed by external ceramic filters (not shown) of approximately 170 KHz bandwidth, as used for TV sound IF stages.

Figure 13:
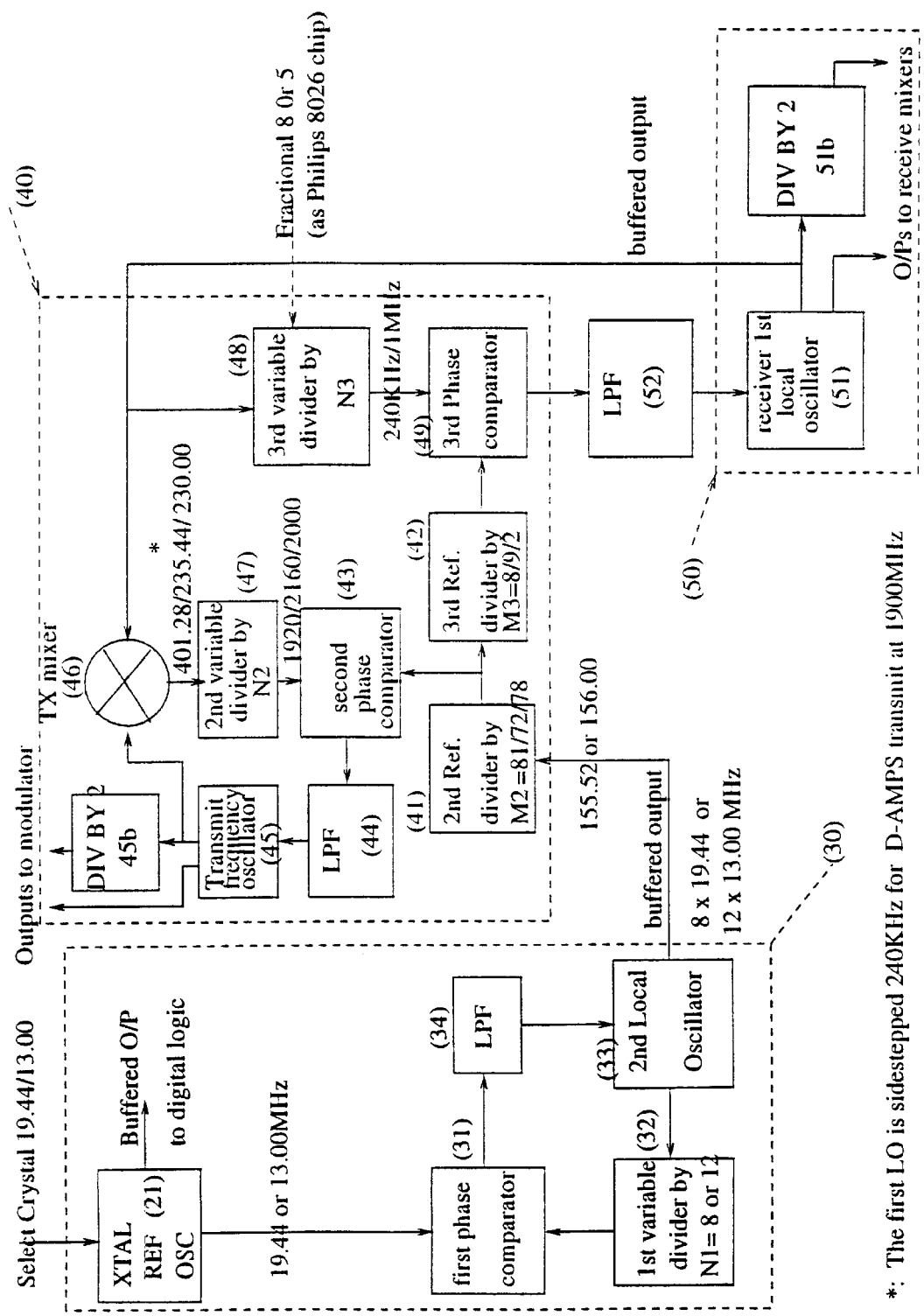
FIG. 13 illustrates divider ratios for the dual-mode radio of FIG. 12.

When operating in the narrowband AMPS mode at 800 MHz, the duplex spacing is 45 MHz and so the transmitter frequency is 45+155.64 MHz below the first LO. The TX offset would therefore be 200.64 MHz. However, as shown in FIG. 13, the TX mixer (46) mixes transmit and receiver oscillators (45,51) at double the 800 MHz frequency, and so produces an offset of 401.28 MHz. This has a highest common factor of 1920 KHz with the second LO of 155.52 MHz, so divider (47) divides the TX offset from TX mixer (46) by a first integer N2 to obtain a first 1920 KHz signal, and divider (41) divides the second LO from IF chip (30) by and integer M2=81 to produce a second 1920 KHz signal. The two 1920 KHz signals are compared in transmit phase comparator (43) to produce an error signal. The error signal is filtered and integrated in loop filter (44) to produce a control signal for TX oscillator (45) to maintain it at the desired frequency, which, when halved in divider (45b), is the desired 800 MHz transmit frequency.

This frequency plan at 800 MHz may also be used for the D-AMPS mode in the 800 MHz band. For operating in the D-AMPS mode at 1900 MHz, the duplex spacing is 80.04 MHz, so that the transmit offset is 80.04+155.64 MHz= 235.68 MHz. This is not simply related to second LO frequency of 155.52 MHz; however, since only time-duplex modes are used at 1900 MHz such that transmission and reception occur in different timeslots and not simultaneously, the first local oscillator may be sidestepped by the relatively small amount of 240 KHz between transmit and receive so that a TX offset of 235.44 MHz may be used instead of 235.68 MHz.

The slightly modified TX offset of 235.44 MHz shares a common factor of 2160 KHz with the second LO of 155.52 MHz. Thus in the 1900 MHz D-AMPS mode, divider (47) divides by an integer N2 reprogrammed to divide 235.44 MHz to 2160 KHz, while divider (41) is reprogrammed to divide by an M2 of 72 to obtain 2160 KHz, the phase comparator (43) now comparing signals at 2160 KHz instead of 1920 KHz.

Finally, to obtain the PCS1900 mode, where the duplex offset is 80 MHz, the transmit offset is 80+150 MHz, as the first IF is 150 MHz in that mode. The 230 MHz TX offset shares a common divisor of 2 MHz with the second LO that is now 156 MHz. This mode is also time duplex, and the first LO could be sidestepped to modify the TX offset from 230 MHz to for example 234 MHz, which has the much larger common factor of 78 MHz with the 2nd LO of 156 MHz. Nevertheless, it may be advantageous to keep a phase comparison frequency of 2 MHz, which makes all phase comparison frequencies (1920,2160 and 2000 KHz) sufficiently close to facilitate the use of a common loop filter (44) and phase comparator (43). Otherwise, if desired to take advantage of a larger common factor such as 78 MHz, a different loop filter and even phase comparator may become necessary to provide the desired closed loop characteristics of stability and lock-in time. Thus the arrangement of FIG. 13 has deliberately aimed to maintain roughly the same TX offset loop operational characteristics of loop-bandwidth and lock-in time in all bands and modes.

Figure 14:
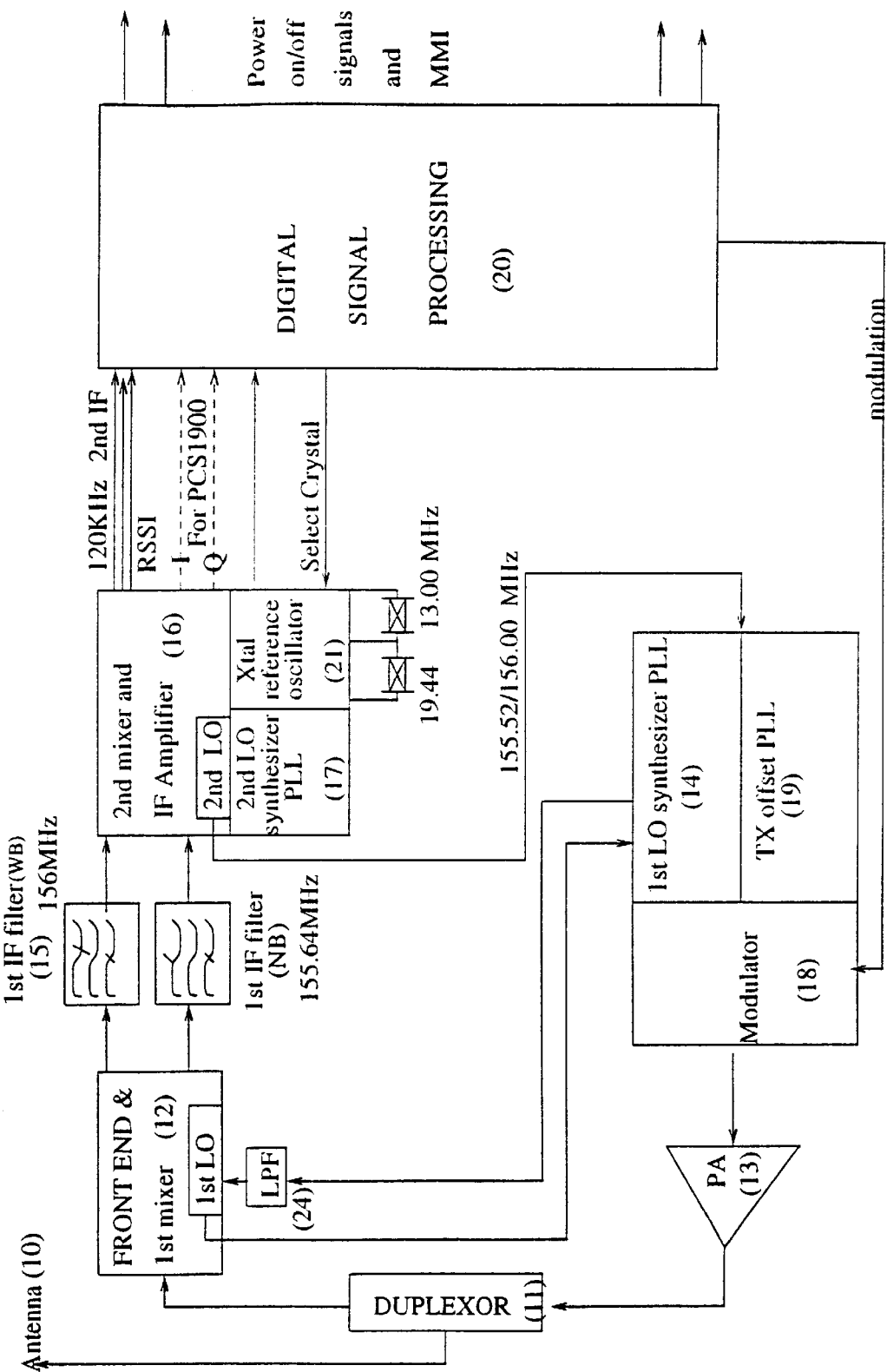
FIG. 14 illustrates a dual-mode radio using I.F. Homodyne for a PCS1900 mode.

The dual-mode, dual-band transmitter-receiver of FIGS. 12 and 13 assumes a double superheterodyne receiver is used in all modes. In the narrowband AMPS and D-AMPS modes, the second intermediate frequency is 120 KHz and the second IF filters are integrated, on-chip, active filters; in the wideband PCS1900 modes, which can include all GSM voice and data modes, satellite communication modes and GPRS packet data modes, the second IF is 6 MHz, and the second IF filters are more difficult to integrate at that frequency. An alternative receiver architecture for the wideband mode is shown in FIG. 14, in which the second IF in the wideband mode is zero frequency, otherwise known as an "IF Homodyne", as opposed to an RF Homodyne, which converts directly from the frequency received at the antenna to zero frequency in one conversion step. The receiver of FIG. 14 converts from the frequency received at the antenna to zero frequency in two steps, the first step converting to a first Intermediate Frequency of 156 MHz and the second step converting from 156 MHz to zero frequency by mixing with the 156 MHz local oscillator. Since the first IF in FIG. 14 is now 156 MHz as opposed to the 150 MHz of FIGS. 12 and 13, the TX offset for 1900 MHz is now 156+80=236 MHz, which still shares a common factor of 2 MHz with the 156 MHz local oscillator. Thus the only change to FIG. 13 is that the value of N2 for PCS1900 operation would change from 230/2=115 to 236/2=118. If desired, a higher common factor of 4 MHz could be used by changing N2 to 236/4=59 and M2 from 78 to 39, and M3 from 2 to 4 (or alternatively changing the fractional-N modulus of N3 to accept a higher reference frequency for third phase comparator (49).

The implementations of FIGS. 12, 13 and 14 use two different reference crystals, although only one is active at any time. Nevertheless this adds the complication that both crystals must be independently temperature compensated, as every crystal has different individual temperature compensation needs. Temperature compensation is carried out by a "self-learning" technique, whereby the receiver locks to a base station signal and then uses the base station signal frequency as a basis for correcting crystal error. The prevailing temperature is measured using a thermistor, and the correction applied to the crystal is stored in a table against the prevailing temperature in microprocessor memory in digital signal processor (20).

Figure 15:
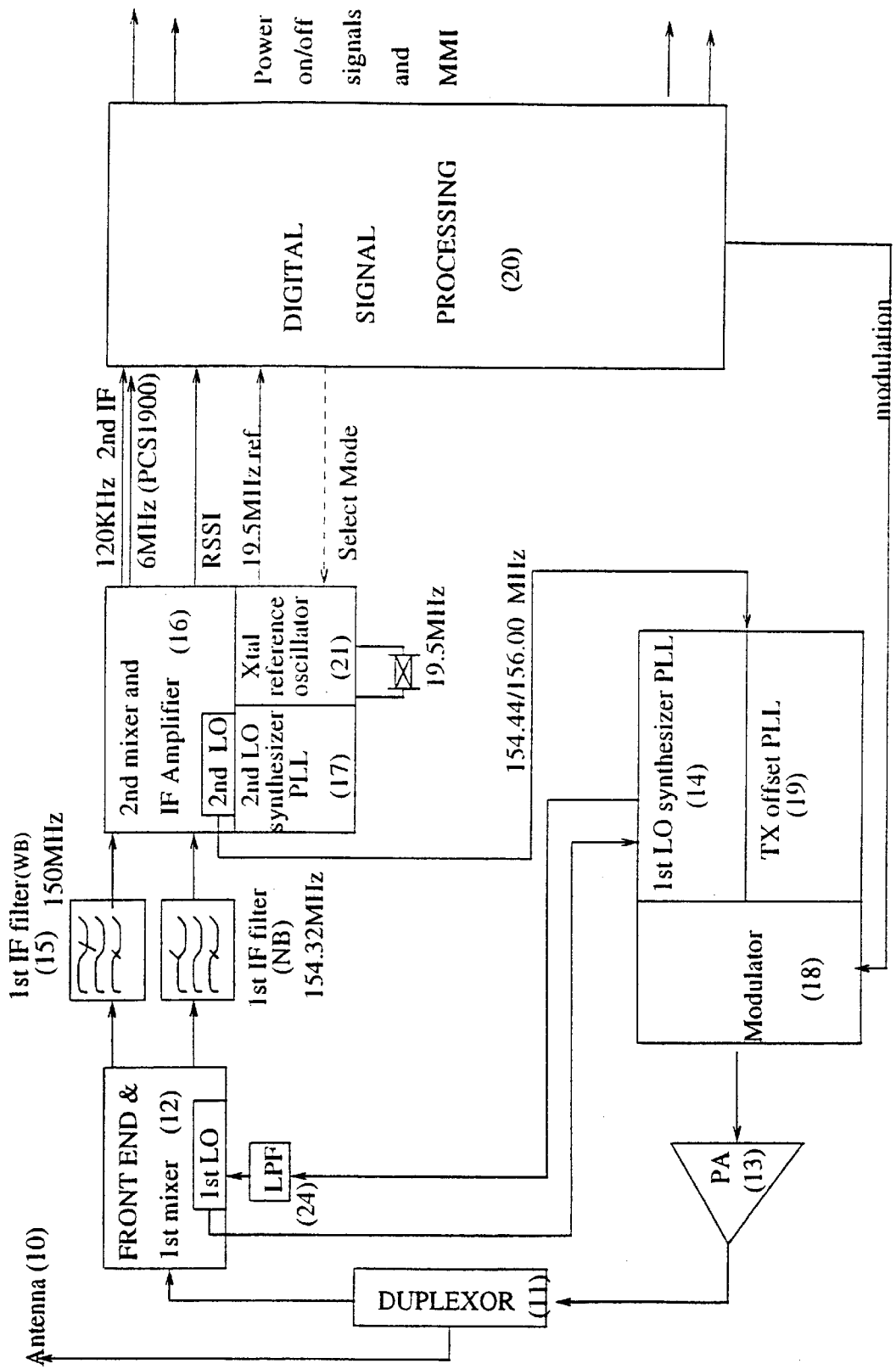
FIG. 15 illustrates a dual-mode radio using a single crystal.
Figure 16:
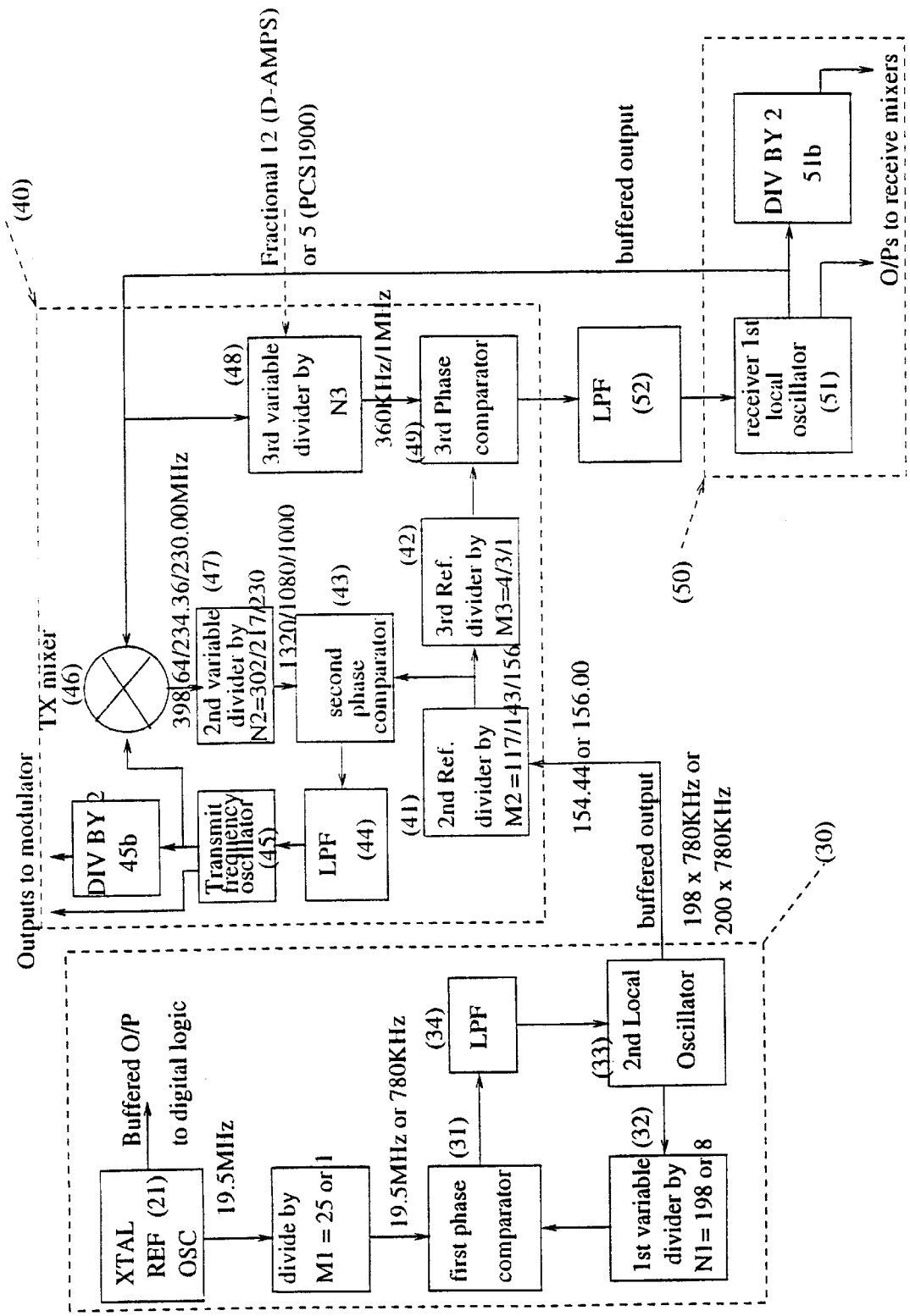
FIG. 16 illustrates divider ratios for the dual-mode radio of FIG. 15.

To simplify the temperature compensation as well as eliminating the cost and board area associated with a second crystal, it is therefore of interest to consider the solutions of FIGS. 15 and 16 using a single crystal. The solution of FIG. 15 is to choose a compromise crystal frequency of 19.5 MHz. This is 1.5 times the 13 MHz from which PCS1900 bitrates are derived, and the bitrate is still derivable as 19.5 MHz/72 as opposed to 13 MHz/48. 19.5 MHz is also close to the 19.44 MHz needed for D-AMPS modes, from which the symbol rate of 24.3 KS/S is derived by dividing by 800. When 19.5 MHz is used, the error is 0.3%, which would cause a timing drift in the transmitted symbol stream of exactly half a symbol period during transmission of a TDMA burst of 6.667 mS or 162 symbols duration. In principle, such an error is no greater than must in any case be anticipated by the receiver due to multipath propagation causing transmission path delay variations of up to one symbol. Nevertheless it is desirable to correct the transmitted signal so that its errors do not compound the imperfections introduced by the propagation path. To a first approximation, the symbol rate error can be reduced by dividing the crystal frequency by 802 to obtain the symbol rate with a residual error of 0.0585%, giving a timing drift of less than one tenth of a symbol over a 162-symbol burst duration. A further refinement can be made by means of a skip-counter, which divides sometimes by 802 and sometimes by 803 in order to create a more accurate approximation to the 24.3 KS/S symbol rate. However, in one implementation, the 24.3 KS/S modulation is generated digitally at the rate of 8 samples per bit. Several samples per bit are used to represent the curved waveform of a symbol stream that has been filtered using a root-raised-cosine filter frequency response. Thus it is really desired to create an accurate approximation to 8 times the symbol rate, or 194.4 kilosamples per second, by dividing the crystal frequency sometimes by 100 and sometimes by 101. The number of times N1 division by 100 occurs and the number of times N2 that division by 101 occurs will now be derived.

The D-AMPS frame repetition period of 20 mS represents 390,000 cycles of a 19.5 MHz clock as opposed to 388,800 cycles of a 19.44 MHz clock.

A timing generator is thus programmed to divide by 390,000 when a 19.5 MHz clock is used as opposed to 388,800 when a 19.44 MHz clock is used, in order to create the 20 mS repetition period. The D-AMPS TDMA frame is divided into 3 timeslots, and one timeslot is thus 130,000 cycles of a 19.5 MHz clock in duration as opposed to 129,600 cycles of a 19.44 MHz clock. The first equation for N1 and N2 is therefore that $$100 \cdot N1 + 101 \cdot N2 = 130{,}000$$

In addition, the total number of ⅛th symbol sample periods to be created is 8×162=1296 as before, so the second equation for N1 and N2 is $$N1 + N2 = 1296$$

Solving these equations gives N2=400, N1=896.

Figure 20:
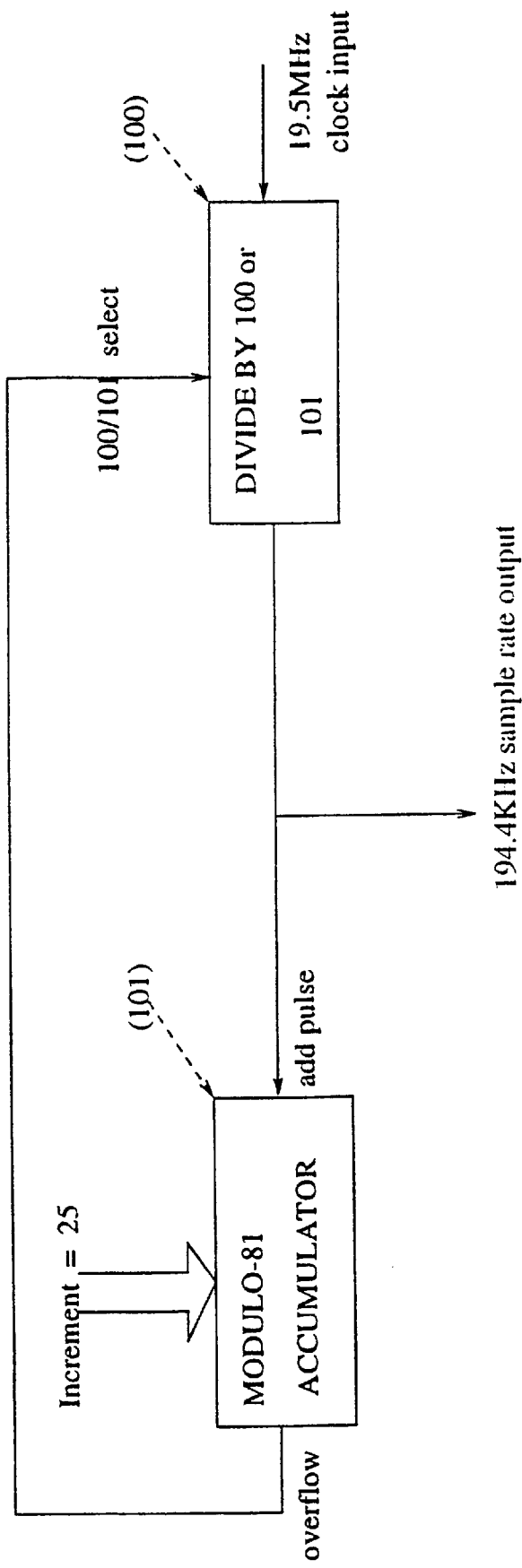
FIG. 20 illustrates a skip-counter for generating 194.4 KHz from 19.5 MHz.

Thus a skip counter is programmed to divide by 100 a total of 896 times interspersed with dividing by 101 a total of 400 times, creating a total of 1296 ⅛th symbol periods with no timing error greater than of the order of half a clock period of the 19.5 MHz clock, or 25 nanoseconds. FIG. 20 shows a skip counter design accomplishing the above. A divider (100) is configured to divide either by 100 or by 101 according to a control input from accumulator (101), so that successive output pulses from the divider (100) will be spaced by either 100 cycles of the 19.5 MHz clock or by 101 cycles. The accumulator (101) is configured as a modulo-81 accumulator, which means that if after adding an increment, the value in the accumulator is equal to or greater than 81, then 81 is subtracted from the accumulator value and an overflow or carry pulse is generated. The carry pulse output from accumulator (101) is used to cause divider (100) to divide by 101.

If no carry is generated by accumulator (101) upon being caused to increment by the last divider (100) output pulse, then divider (100) counts 100 cycles of the 19.5 MHz clock input to produce the next output sample rate pulse. Else, if upon the last divider output pulse causing the accumulator to increment and overflow, then the accumulator carry output fed back to divider (100) causes the divider to count 101 cycles of the 19.5 MHz clock input before producing the next divider output sample rate pulse.

By setting the accumulator increment equal to 25, the accumulator produces a carry pulse 25/81 ths of the time, which is equal to 400/1296 ths of the time, this being the proportion of divide-by-101's calculated above needed to produce the exact number 1296 of 8×symbol rate pulses in a D-AMPS timeslot.

FIG. 16 shows the internal frequency plan using a 19.5 MHz crystal. The first IF in D-AMPS mode is changed to 154.32 MHz to give high phase comparator frequencies of 1320 KHz and 1080 KHz for transmit phase comparator (43) in 800 and 1900 MHz operation respectively, while also giving a high comparison frequency of 780 KHz at 2nd LO phase comparator (31).

Figure 17:
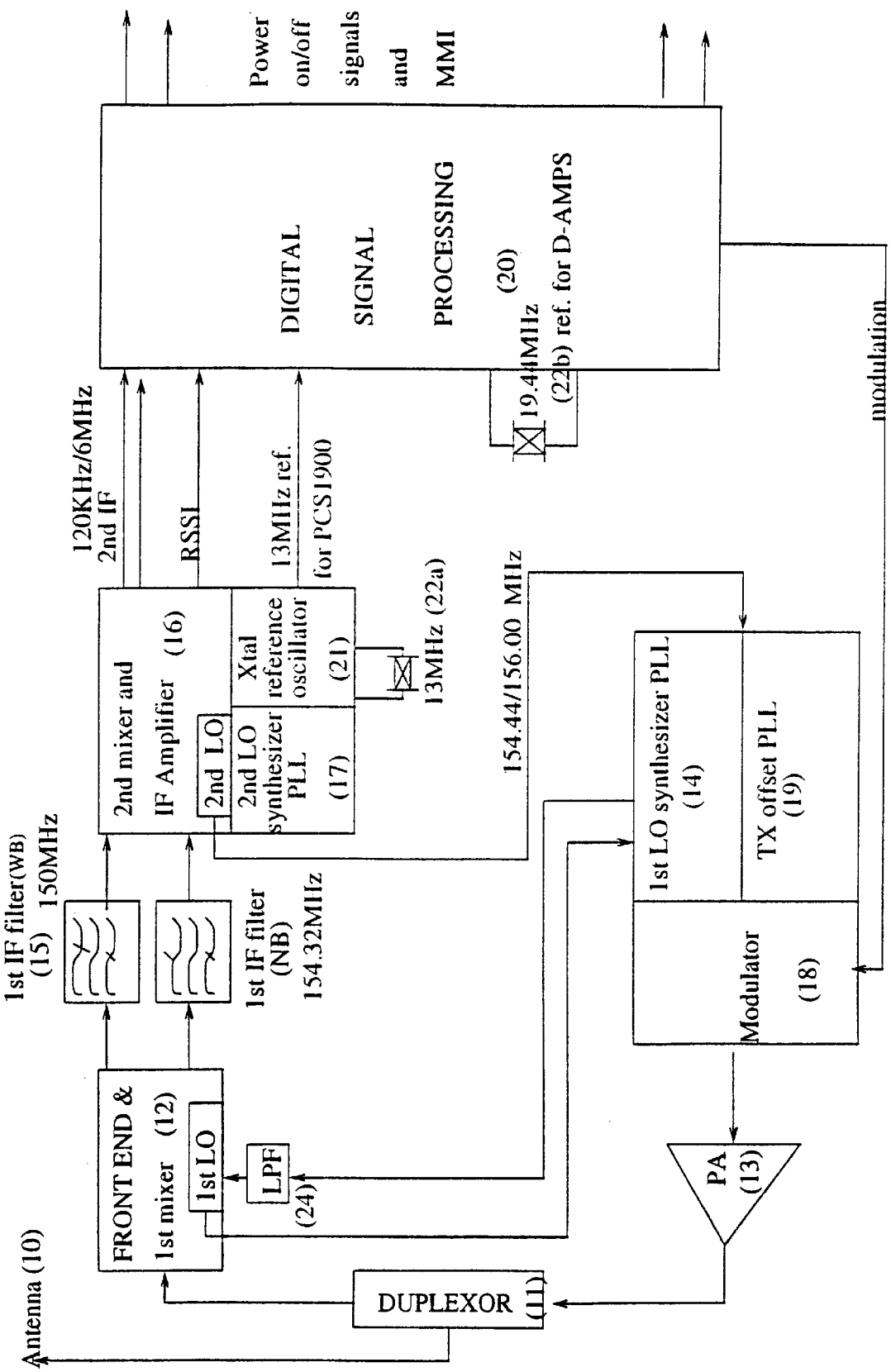
FIG. 17 illustrates a dual-mode radio using two reference crystals.

Yet another implementation of the invention is shown in FIG. 17, this time using a 13 MHz crystal to derive all radio oscillator frequencies, and a 19.44 MHz crystal connected to digital chip (20) only to derive bit and digital sampling rates for the AMPS and D-AMPS modes. The frequency plan for this case is shown in FIG. 18, in which substantially the only difference from FIG. 16 is that the second LO phase comparator now operates at 520 KHz.

Figure 18:
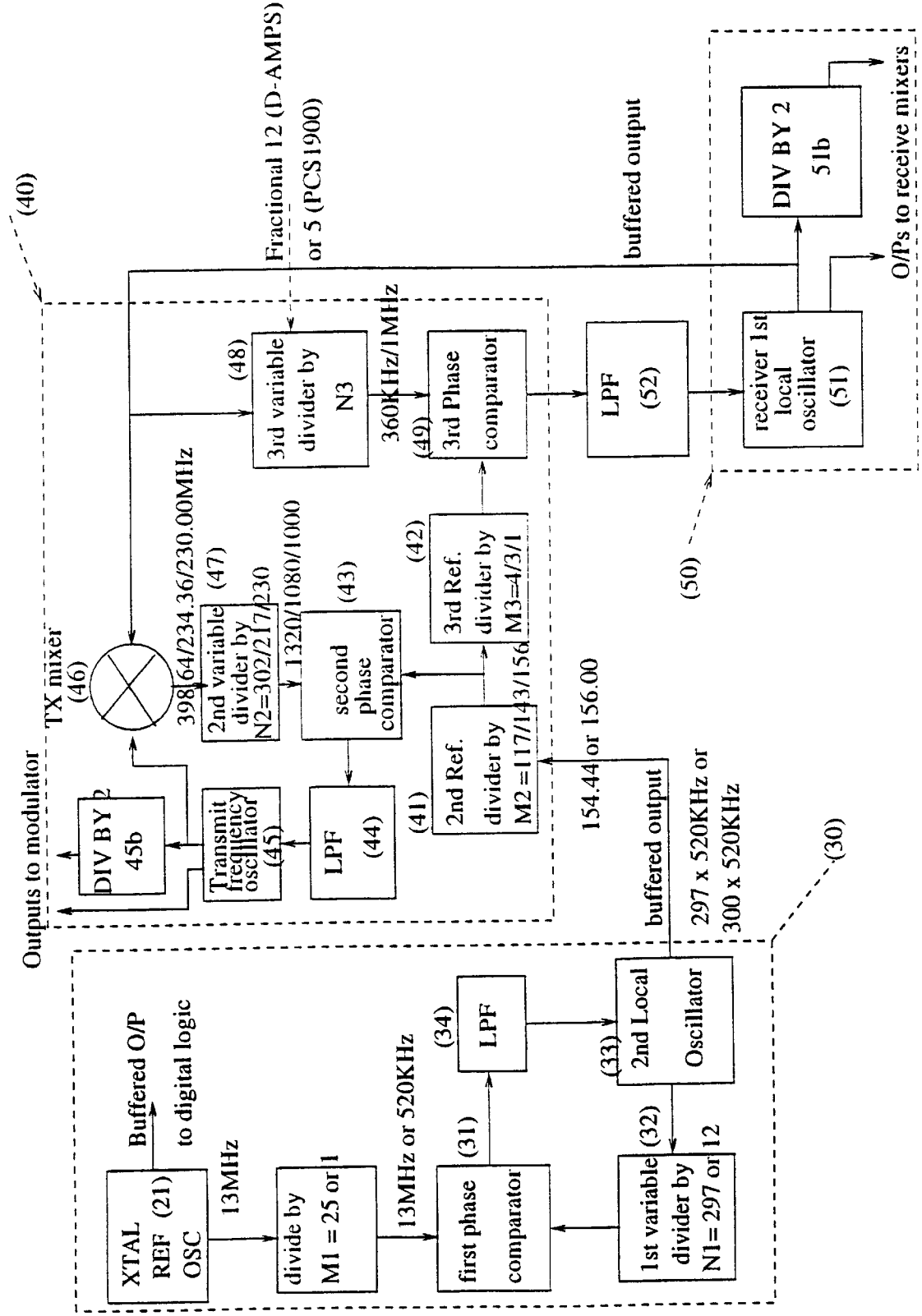
FIG. 18 illustrates divider ratios for the dual-mode radio of FIG. 17.

In both FIG. 16 and FIG. 18, the main receiver synthesizer (the first LO) operates as a fractional-N synthesizer with a modulus of 5 (optionally 10 or 20) in PCS1900 mode, and 12 in AMPS and D-AMPS modes.

Figure 19:
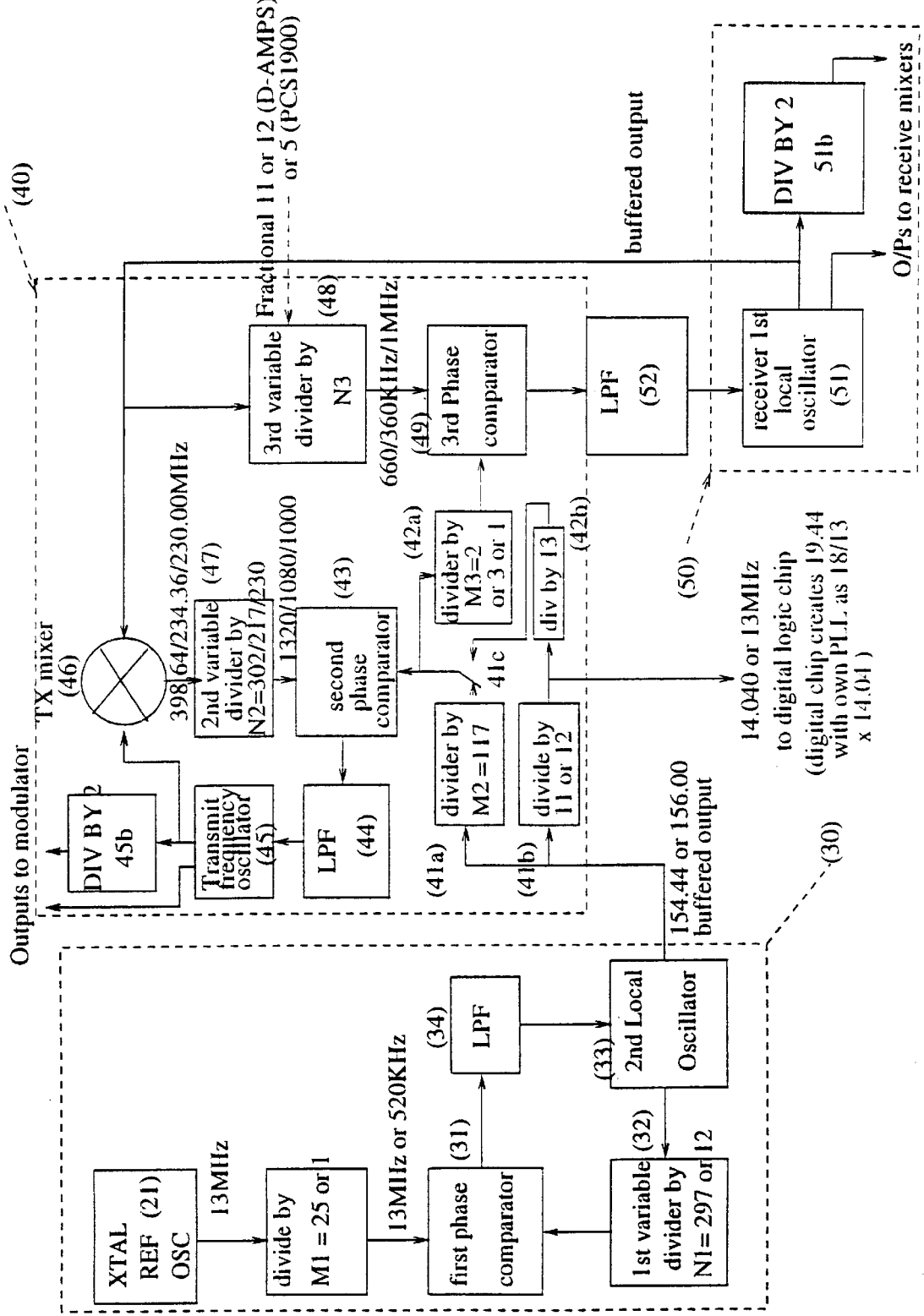
FIG. 19 illustrates divider ratios to eliminate the second crystal of FIG. 17.

It is possible to eliminate the 19.44 MHz crystal used only for generating digital clocks by using the arrangement of FIG. 19, in which the digital chip (20) creates its own 19.44 MHz clock by means of an internal PLL when needed. To facilitate this, dividers (41) and (42) are split into two dividers (41a,41b) and (42a,42b). Divider 41a divides the 2ND LO frequency of 154.44 MHz by 117 in D-AMPS mode at 800 MHz to obtain 1320 KHz at which the transmit phase comparator (43) operates. Selector switch 41c is operated to select the output of divider 41a in this mode. During-this mode, divider 41b operates simultaneously, dividing by 11 to provide a 14.040 MHz output to the digital chip (20). This frequency shares a common factor of 1080 KHz with the 19.44 MHz generated on the digital chip (20) by means of a local PLL when needed. Divider (42a) operates at this time to divide the operation frequency of phase comparator (43) by a further factor of 2 to obtain 660 KHz, which is used along with a modulus-11 fractional-N divider (43) to provide 60 KHz steps of oscillator (51), which provides 30 KHz steps after division by 2 for 800 MHz AMPS or D-AMPS operation. For 1900 MHz D-AMPS operation switch 41c selects instead the output of divider (42b) which is 14.04 MHz divided by 13, that is 1080 KHz. This is the desired frequency to provide the duplex offset of 80.04 MHz at 1900 MHz compared to 45 MHz at 800 MHz. The selected 1080 KHz for phase comparator (43) is then further divided by 3 in divider (42a) reprogrammed to divide by 3, giving a 360 KHz phase comparison frequency for phase comparator (49), which, together with the use now of a fractional-N modulus of 12 for divider (48), gives 30 KHz tuning steps for oscillator (51) during D-AMPS operation at 1900 MHz. For PCS1900 operation, divider (41b) is programmed to divide by 12, dividing the second LO of now 156 MHz to provide a 13 MHz clock output to the digital chip (20). The 13 MHz is divided by 13 in divider (42b) to 1 MHz, which is the operating frequency of phase detectors (43,48). Divider (42a) is thus programmed to make M3=1. Using a fractional-N modulus of 5 for divider (48) provides the desired 200 KHz steps in this mode.

It has thus been shown above that the invention permits the construction of dual-band, dual-mode transceivers using either a single crystal reference or two crystals in a variety of ways to derive alternative symbol rates of 270.833 KB/S and 24.3 KS/S, alternative channel spacings of 30 KHz or 200 KHz, and transmit-receive duplex spacings of 45 MHz, 80.04 MHz or 80.00 MHz.

Moreover, this flexibility is achieved with an improved architecture as compared with the prior art, allowing the radio hardware to be reduced to essentially three integrated circuit chips having a reduced number of RF interconnections there between, thus minimizing risks of internal interference and reducing power consumption.

According to another aspect of the present invention, the tuning bandwidth is minimized. According to the exemplary embodiments to be described below, the LO fed into the first downconverter of a heterodyne receiver is doubled before it is injected into the higher band receiver. The IF is preferably chosen from between 192 MHz and 202 MHz, as an IF choice beyond this range will likely increase the required tuning bandwidth of the common receive VCO. It is also preferable that the LO for both receiver bands is fed on the higher frequency side.

Figure 21:
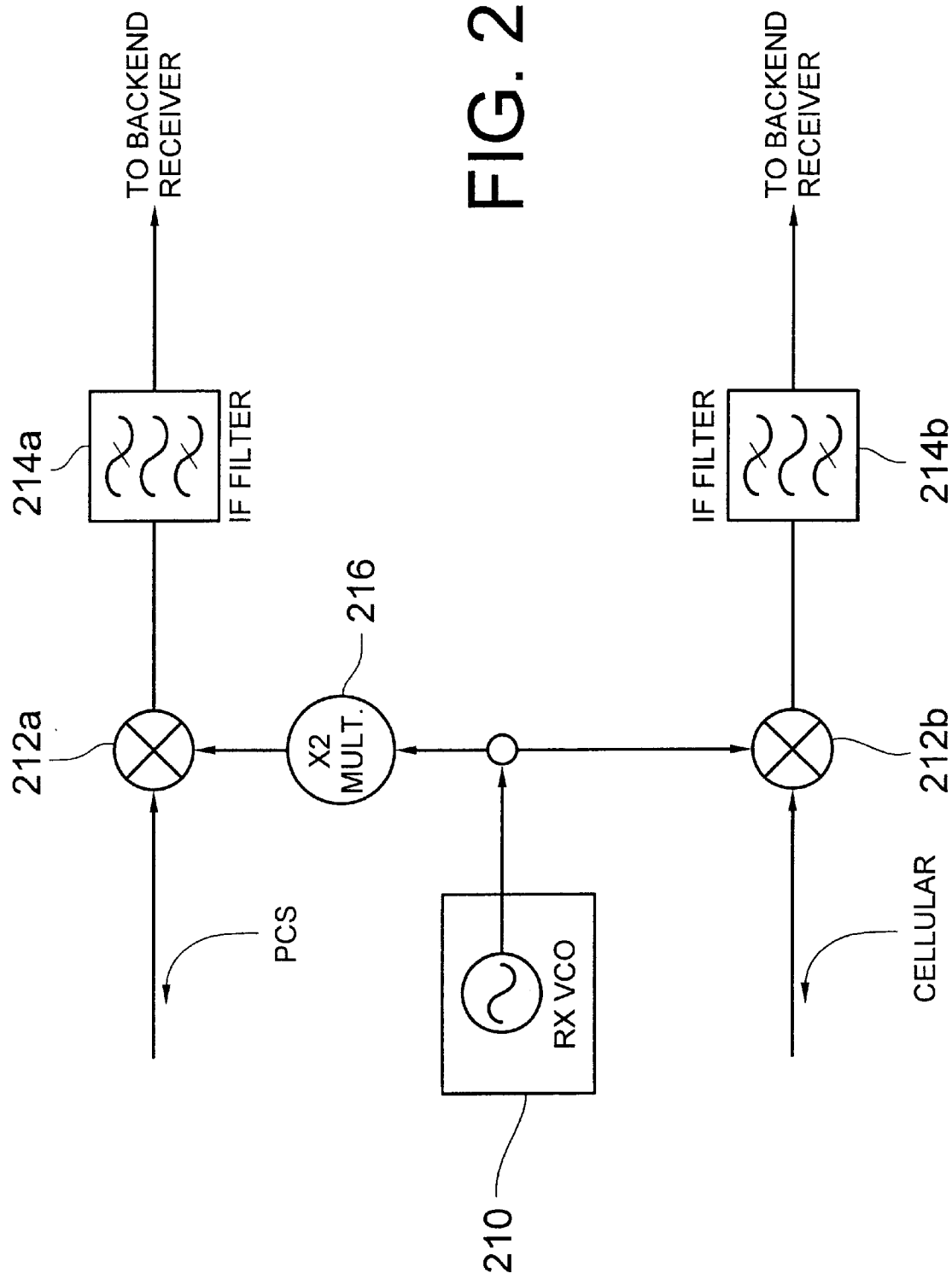
FIG. 21 illustrates a block diagram of a dual band receiver according to an aspect of the invention.

FIG. 21 shows one implementation, in a block diagram, of a dual band receiver implementing a dual band communication standard (IS-95, for example). In this case the cellular band IF filter is 30 KHz wide (AMPS operation example), whereas the PCS band IF filter is 1.25 MHz wide (CDMA operation example). The band centers are preferably within 5 MHz of each other within the above frequency range so that the total tuning range is not increased.

In FIG. 21, the LO 210 is fed to first downconversion mixers 212a,b of the superheterodyne receiver, leading to the following equations to optimize the IF choice for a minimum VCO tuning range.

For a high side LO in both bands:

$$LO_{Cellular} = RX_{Cellular} + IF$$

$$LO_{PCS} = RX_{PCS} + IF$$

$$VCO_{Cellular} = LO_{cellular}$$

$$VCO_{PCS} = LO_{PCS}/2$$

To minimize tuning range, the VCO frequencies should be from the same set. The VCO should tune 25 MHz to cover the cellular band receiver and 30 MHz to cover the PCS band receiver. Therefore, if:

$$VCO_{Cellular} = VCO_{PCS}$$

Then:

$$LO_{cellular} = LO_{PCS}/2$$

$$RX_{Cellular} + IF = (RX_{PCS} + IF)/2$$

$$2*RX_{Cellular} + 2*IF = RX_{PCS} + IF$$

$$2*RX_{Cellular} + IF = RX_{PCS}$$

$$IF = RX_{PCS} - 2*RX_{Cellular}$$

Since the Cellular band range swings 5 MHz less than the PCS band range, there is a set of IF frequencies that will satisfy the above requirement. We can find this range by equating the equations at the high end of the receive range and the low end of the receive range. The low end relation yields the following IF frequency:

$$IF = RX_{PCS} - 2*RX_{Cellular}$$
$$= 1930 \text{ MHz} - 2*869 \text{ MHz}$$
$$= 192 \text{ MHz}$$

The high end relation yields the following IF frequency:

$$IF = RX_{PCS} - 2*RX_{Cellular}$$
$$= 1990 \text{ MHz} - 2*894 \text{ MHz}$$
$$= 202 \text{ MHz}$$

Therefore, if then IF filters 214a,b are restricted to the 192–202 MHz window, the tuning range can be limited to approximately 30 MHz of the shared receiver VCO 210. It is desirable to have a frequency doubler 216 for the higher band LO and high-side injection for both receivers.

Figure 22:
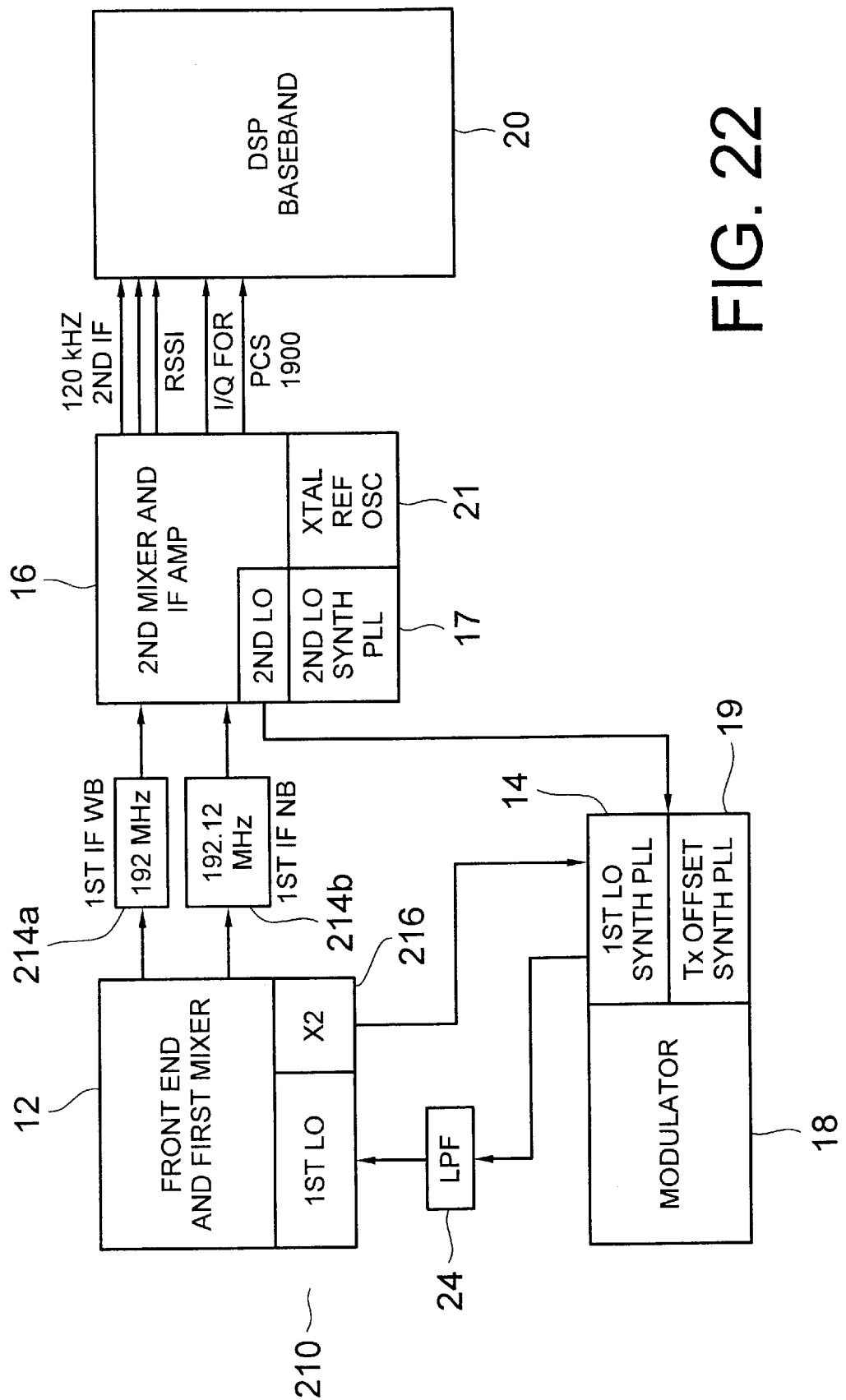
FIG. 22 illustrates a more detailed block diagram of the receiver of FIG. 21.

Within this frequency range, an illustrative example is shown in FIG. 22. The exemplary embodiment has an IF filter frequency of 192 MHz for the CDMA path and an IF filter frequency of 192.12 MHz for the AMPS path. In this example, the $2^{nd}$ LO is a reference for the $1^{st}$ LO and the transmit offset generation. In principal, a crystal reference could also be used. The $2^{nd}$ LO is 192 MHz for both bands and is locked to the crystal reference. The crystal reference can be 19.2 MHz. The crystal reference divided by 4 yields 4.8 MHz while the $2^{nd}$ LO divided by 40 yields the common comparison frequency of 4.8 MHz which should be sufficient.

In the PCS band, using the $2^{nd}$ LO as a reference to the $1^{st}$ LO, the $2^{nd}$ LO can be divided by 384 to get a comparison of 500 KHz. The $1^{st}$ LO can provide 50 KHz channel stepping in this band by providing fractional 10 division. In the Cellular band, using the $2^{nd}$ LO as a reference to the $1^{st}$ LO, the $2^{nd}$ LO can be divided by 400 to get a comparison of 480 KHz. The $1^{ST}$ LO Can provide 30 KHz channel stepping in this band by providing fractional 16 division.

When operating in narrowband AMPS mode in the cellular band, the transmit frequency is 45.00+192.00 MHz below the $1^{st}$ LO. The transmit offset for cellular band, therefore, would be 237 MHz. Similarly, for operation of wideband CDMA mode in the PCS BAND, the transmit frequency is 80.00+192.00 MHz below the $1^{st}$ LO. The transmit offset for PCS band would be 272 MHz. Using the $2^{nd}$ LO as a reference for locking these signals in a PLL would require division by 192 for a comparison of 1 MHz. For PCS, the transmit offset signal would have to be divided by 272 while for cellular band the division would be by 237. In both cases the phase comparison is accomplished at 1 MHz.

It will be appreciated that the above was merely an example to show that realistic solutions can be achieved within the preferred frequency range (192–202 MHz). Similar design could be done with other frequencies within the range and with the crystal or $2^{nd}$ LO being used as reference. The example above had IF filters with significantly different bandwidths. The utility would still apply with a GSM/AMPS phone where the bandwidths would be 200 KHz and 30 KHz, respectively. The invention is useful for an IS-136 application where both filters would have a 30 KHz bandwidth. In that case, one filter could be shared as opposed to using two separate IF filters.

Thus, by choosing IF frequencies within the 192–202 MHz window, the tuning range can be limited to 30 MHz of a shared receiver VCO. This limited tuning rage allows for a similar VCO gain in a 3-cell phone [17.61] compared to a 5-cell phone [20]. The same close intermodulation performance for this reduced voltage phone is substantially the same as for a 5-cell phone, without any additional circuits (as would be required for a voltage doubler) over what would normally by used in the 5-cell receivers.

If the invention is implemented in a 5-cell dual band receiver, the VCO gain is reduced from 20 (75 MHz/3.8 V) to 8 (30 MHz/3.8 V). With this much lower gain, the close in intermodulation performance should be much easier to attain. The same performance can be maintained with a less expensive VCO.

Alternatively, the invention can result in a lower cost 5-cell type VCO by maintaining the wider tuning range (and receiver close-in intermodulation performance) and using the extra range for electronically calibrating the varactor of the VCO onto the correct range for our receiver. The VCO would be less expensive because it would be factory built without laser or mechanical trimming.

Thus, the invention achieves many unobvious advantages with respect to the VCO. An IF in this range has other benefits. First, the image filtering is easier because this IF is higher than that used in previous phones (i.e., 45 MHz, 72 MHz, 110.52 MHz). Second, because the IF is significantly greater than twice the receiver range (2*60 MHz or 120 MHz), the ½IF requirements of the receiver are much easier to meet because they can be filtered.

From a practical point of view, the present invention is particularly well-suited for a dual band CDMA phone. The IS-95 standard is specified such that the required performance for this filter can be readily met with SAW filters in this frequency range.

The use of the present invention in an IS-136 phone is more difficult because the IF filtering required by the standard is more difficult to meet at these frequencies. However, SAW and crystal filters up to 300 MHz can make this a practical solution also for the IS-136 standard.

This invention would also be useful in any dual band phone wherein the band centers of the first and second bands have a ratio of approximately 2:1; i.e., where the second band or band center is approximately twice the first band.

The invention may be useful in other contexts, whenever it is desired to minimize oscillator tuning bandwidth. The invention may be adapted by a person skilled in the art using the above teachings while remaining within the spirit and scope of the invention as described by the following claims.

What is claimed is:

1. A multiple-band communication device for receiving communication signals in one of a plurality of bands, comprising:

a single voltage controlled oscillator having a tuning range, the oscillator generating an oscillator signal at one of at least two frequencies corresponding to first and second bands;

first and second downconversion mixers, each downconversion mixer generating an intermediate frequency signal for the first and second bands, respectively, from the oscillator signal and from a received communication signal;

first and second filters, each filter filtering the intermediate frequency signal in the first and second bands, respectively; and means for processing the filtered intermediate frequency signals, wherein the first and second filters minimize the tuning range of the voltage controlled oscillator by filtering signals within a frequency range defined by first and second values, the first and second values determined by $RX_1-2RX_2$ using a highest and a lowest expected receive frequency $RX_1$ for the first band and $RX_2$ for the second band.

2. The device of claim 1, wherein the tuning range is limited to approximately 30 MHz.

3. The device of claim 1, wherein the first band is a cellular communications band corresponding to the AMPS standard and the second band is the PCS frequency band.

4. The device of claim 3, wherein the first and second values are 192 and 202 MHz, respectively.

5. The device of claim 1, further comprising a frequency multiplier for multiplying the frequency of the oscillator signal for one of the two bands.

6. The device of claim 1, further comprising a battery power source having fewer than 5 battery cells.

7. The device of claim 1, wherein the single voltage controlled oscillator has a gain of less than 20.

8. The device of claim 1, wherein the first and second bands correspond to GSM frequency bands.

9. The device of claim 1, wherein the first band corresponds to a frequency band within a range of approximately 800–900 MHz and the second band corresponds to a frequency band with a range of approximately 1900–2000 MHz.

10. The device of claim 1, wherein a band center of the second band is approximately twice a band center of the first band.

* * * * *